(12) United States Patent
Sato et al.

(10) Patent No.: US 7,031,195 B2
(45) Date of Patent: Apr. 18, 2006

(54) NONVOLATILE SEMICONDUCTOR MEMORY HAVING A CONTROL GATE DRIVER TRANSISTOR WHOSE GATE INSULATOR THICKNESS IS GREATER THAN THAT OF A SELECT GATE DRIVER TRANSISTOR

(75) Inventors: Atsuhiro Sato, Zushi (JP); Riichiro Shirota, Fujisawa (JP); Kikuko Sugimae, Yokohama (JP); Koji Sakui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/948,295

(22) Filed: Sep. 24, 2004

(65) Prior Publication Data

US 2005/0094431 A1    May 5, 2005

(30) Foreign Application Priority Data

Sep. 30, 2003    (JP) ............................ P2003-341808

(51) Int. Cl.
*G11C 16/08* (2006.01)

(52) U.S. Cl. ..................... 365/185.23; 365/185.12; 365/185.29

(58) Field of Classification Search .......... 365/185.12, 365/185.11, 185.23, 185.29
See application file for complete search history.

(56) References Cited

U.S. PATENT DOCUMENTS

| | | | |
|---|---|---|---|
| 6,316,317 B1 | 11/2001 | Kawata et al. .............. 438/289 |
| 6,813,216 B1* | 11/2004 | Lee ....................... 365/230.06 |
| 6,934,192 B1* | 8/2005 | Tailliet et al. .......... 365/185.29 |
| 6,937,515 B1* | 8/2005 | Sudo et al. ............ 365/185.12 |

FOREIGN PATENT DOCUMENTS

| | | | |
|---|---|---|---|
| JP | 4-165670 | * | 6/1992 |
| JP | 2000-269361 | | 9/2000 |

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A nonvolatile semiconductor memory includes: a memory sub array including a memory cell unit configured with a memory cell transistor and a select transistor connected in series; a control gate line driver including a control gate line driver transistor connected to a control gate line of the memory cell transistor; and a select transistor gate line driver including a select gate line driver transistor connected to a select gate line of the select transistor. A thickness of a gate insulator of the control gate line driver transistor is thicker than that of the select gate line driver transistor.

18 Claims, 30 Drawing Sheets

FIG. 5

| | |
|---|---|
| CGDd | Vss |
| CGDg (SELECTED; ERASED BLOCK) | Vcc |
| CGDg (UNSELECTED; UNERASED BLOCK) | Vss |
| CG (SELECTED; ERASED BLOCK) | Vss |
| CG (UNSELECTED; UNERASED BLOCK) | Vpp_erase2 (FLOATING) |
| STDd | Vcc |
| STDg | Vcc |
| SG | Vpp_erase3 (FLOATING) |
| BLk | Vpp_erase-Vfb |
| SOURCE (MEMORY CELL) | Vpp_erase-Vfb |
| p WELL, n WELL (MEMORY CELL) | Vpp_erase |
| SEMICONDUCTOR SUBSTRATE | Vss |

FIG. 6

| | |
|---|---|
| CGDd | Vpp_prog |
| CGDg (SELECTED; WRITTEN IN BLOCK) | Vpp_prog1 |
| CGDg (UNSELECTED; UNWRITTEN BLOCK) | Vss |
| CG (SELECTED; WRITTEN IN BLOCK) | Vpp_prog |
| CG (UNSELECTED; UNWRITTEN BLOCK) | FLOATING |
| STDd | Vss |
| STDg | Vcc |
| SG | Vss |
| BLk (BIT LINE FOR WRITE-IN "0") | Vss |
| BLk (BIT LINE FOR WRITE-IN "1") | Vm |
| SOURCE (MEMORY CELL) | Vcc |
| p WELL, n WELL (MEMORY CELL) | Vss |
| SEMICONDUCTOR SUBSTRATE | Vss |

| CGDd | Vss |
|---|---|
| CGDg | Vcc |
| TOTAL CG | Vss |
| STDd | Vcc |
| STDg | Vcc+α (SELECTED), Vss (UNSELECTED) |
| SG | Vcc |
| BLk (BIT LINE FOR READ-OUT "0") | Vread→Vread |
| BLk (BIT LINE FOR READ-OUT "1") | Vread→Vss |
| SOURCE (MEMORY CELL) | Vss |
| p WELL, n WELL (MEMORY CELL) | Vss |
| SEMICONDUCTOR SUBSTRATE | Vss |

FIG. 12

| | |
|---|---|
| CGDd | Vss |
| CGDg (SELECTED; ERASED BLOCK) | Vcc |
| CGDg (UNSELECTED; UNERASED BLOCK) | Vss |
| CG (SELECTED; ERASED BLOCK) | Vss |
| CG (UNSELECTED; UNERASED BLOCK) | Vpp_erase2 (FLOATING) |
| STDDd, STDSd | Vcc |
| STDDg, STDSg | Vcc |
| SGD, SGS | Vpp_erase3 (FLOATING) |
| BLk | Vpp_erase-Vfb |
| SOURCE (MEMORY CELL) | Vpp_erase-Vfb |
| p WELL, n WELL (MEMORY CELL) | Vpp_erase |
| SEMICONDUCTOR SUBSTRATE | Vss |

FIG. 13

| | |
|---|---|
| CGDd | Vpp_prog |
| CGDg (SELECTED; WRITTEN IN BLOCK) | Vpp_prog1 |
| CGDg (UNSELECTED; UNWRITTEN BLOCK) | Vss |
| CG (SELECTED; WRITTEN IN BLOCK)) | Vss |
| CG (UNSELECTED; UNWRITTEN BLOCK) | Vpp_prog |
| STDDd | $Vm+\alpha$ |
| STDSd | Vss |
| STDDg | $Vm+\beta$ |
| STDSg | Vcc |
| SGD | $Vm+\alpha$ |
| SGS | Vss |
| BLk (BIT LINE FOR WRITE-IN "0") | Vss |
| BLk (BIT LINE FOR WRITE-IN "1") | Vm |
| SOURCE (MEMORY CELL) | Vcc |
| p WELL, n WELL (MEMORY CELL) | Vss |
| SEMICONDUCTOR SUBSTRATE | Vss |

FIG. 14

| CGDd | Vss |
|---|---|
| CGDg | Vcc |
| TOTAL CG | Vss |
| STDDd, STDSd | Vcc |
| STDDg, STDSg | Vcc+α |
| SGD, SGS | Vcc |
| BLk (BIT LINE FOR READ-OUT "0") | Vread→Vread |
| BLk (BIT LINE FOR READ-OUT "1") | Vread→Vss |
| SOURCE (MEMORY CELL) | Vss |
| p WELL, n WELL (MEMORY CELL) | Vss |
| SEMICONDUCTOR SUBSTRATE | Vss |

FIG. 22

| CGDd | Vpp_erase_minus |
|---|---|
| CGDg (SELECTED ; ERASED BLOCK)) | Vss |
| CGDg (UNSELECTED ; UNERASED BLOCK) | Vpp_erase_minus |
| CGD_Pwell | Vpp_erase_minus |
| CGD_Nwell | Vss |
| CG (SELECTED ; ERASED BLOCK)) | Vpp_erase_minus |
| CG (UNSELECTED ; UNERASED BLOCK) | Vpp_erase2 (FLOATING) |
| STDd | Vcc |
| STDg | Vcc |
| SG | Vpp_erase3 (FLOATING) |
| BLk | Vpp_erase_Vfb |
| SOURCE (MEMORY CELL) | Vpp_erase_Vfb |
| p WELL, n WELL (MEMORY CELL) | Vpp_erase |
| SEMICONDUCTOR SUBSTRATE | Vss |

NONVOLATILE SEMICONDUCTOR MEMORY HAVING A CONTROL GATE DRIVER TRANSISTOR WHOSE GATE INSULATOR THICKNESS IS GREATER THAN THAT OF A SELECT GATE DRIVER TRANSISTOR

CROSS REFERENCE TO RELATED APPLICATIONS

This application is based upon and claims the benefit of priority from prior Japanese Patent Application P2003-341808 filed on Sep. 30, 2003; the entire contents of which are incorporated by reference herein.

BACKGROUND OF THE INVENTION

1. Field of the Invention

The present invention relates to a nonvolatile semiconductor memory that has a memory cell with one floating gate and one select transistor as a basic circuit. More specifically, it relates to a nonvolatile semiconductor memory having a circuit structure that improves read-out speed.

2. Description of the Related Art

An electrically erasable programmable read-only memory (EEPROM), which performs data write-in and erase, has been known as a nonvolatile semiconductor memory (R. Shirota, 'A Review of 256-Mbit NAND Flash Memories and NAND Flash Future Trend', Non-Volatile Semiconductor Memory Workshop (NVSMW) 2000, p. 22–31.). In an EEPROM, especially a NAND type, a memory cell array is configured by deploying or positioning memory cells at the respective intersections of horizontal word lines and vertical bit lines. A MOS transistor having a stacked gate structure configured by stacking a floating gate and a control gate, for example, is typically used as a memory cell.

A representative memory cell of a NAND flash memory is described, for example, in R. Shirota, 'A Review of 256-Mbit NAND Flash Memories and NAND Flash Future Trend', Non-Volatile Semiconductor Memory Workshop (NVSMW) 2000, p. 22–31. The NAND flash memory is structured such that a plurality of memory cell transistors connected in series form a NAND string; and select transistors are deployed or positioning on both sides of that NAND string. In addition, device isolation regions are aligned in parallel to the device activation regions of the memory cells to form a memory cell array. Generally, the gate length of the select transistor is longer than that of the memory cell transistor to effectively prevent degradation in the cut-off characteristics of the transistor due to a short-channel effect. In addition, the select transistor is normally configured with an enhancement MOS transistor.

In the nonvolatile semiconductor memory with a memory cell configured with two transistors, such as a memory transistor and a select transistor, a structure thereof where the thicknesses of a gate oxide film for a memory transistor area and a gate oxide film for a selection transistor area are different from each other has been disclosed (Japanese Patent Application Laid-Open No. 2000-269361).

In addition, a structure where the film thicknesses of a gate oxide film of a selective MOS transistor formed by a gate electrode and a gate oxide film of a MOS transistor in a peripheral circuit are different from each other, has been disclosed (Japanese Patent Application Laid-Open No. Hei 04-165670).

SUMMARY OF THE INVENTION

An aspect of the present invention inheres in a nonvolatile semiconductor memory including: (a) a memory sub array including a plurality of memory cell units, each of which having a memory cell transistor and a select transistor connected in series; (b) a control gate line driver including a control gate line driver transistor connected to a control gate of the memory cell transistor; and (c) a select transistor gate line driver including a select gate line driver transistor connected to a select gate of the select transistor, (d) wherein a thickness of a gate insulating film of the control gate line driver transistor is thicker than a thickness of a gate insulating film of the select gate line driver transistor.

Another aspect of the present invention inheres in a nonvolatile semiconductor memory including: (a) a plurality of memory sub arrays including a plurality of memory cell units, each of which having a memory cell transistor and a select transistor connected in series; (b) a control gate line driver including a control gate line driver transistor connected to a control gate of the memory cell transistor; and (c) a plurality of select transistor gate line drivers including a select gate line driver transistor connected to a select gate of the select transistor, (d) wherein a number of memory sub arrays driven by the control gate line driver is greater than a number of memory sub arrays driven by the select transistor gate line driver.

Another aspect of the present invention inheres in a nonvolatile semiconductor memory including: (a) a plurality of memory sub arrays, each of which including a memory cell unit having a memory cell transistor and two select transistors sandwiching the memory cell transistor; (b) a control gate line driver including a control gate line driver transistor connected to a control gate of the memory cell transistor; and (c) a plurality of select transistor gate line drivers including a select gate line driver transistor connected to a select gate of the select transistor, (d) wherein a thickness of a gate insulating film of the control gate line driver transistor is thicker than a thickness of a gate insulating film of the select gate line driver transistor

BRIEF DESCRIPTION OF DRAWINGS

FIG. 5 is a diagram illustrating a potential relationship during erase in the nonvolatile semiconductor memory according to the first embodiment of the present invention;

FIG. 6 is a diagram illustrating a potential relationship during write-in in the nonvolatile semiconductor memory according to the first embodiment of the present invention;

FIG. 12 is a diagram illustrating a potential relationship during erase in the nonvolatile semiconductor memory according to the fifth embodiment of the present invention;

FIG. 13 is a diagram illustrating a potential relationship during write-in in the nonvolatile semiconductor memory according to the fifth embodiment of the present invention;

FIG. 14 is a diagram illustrating a potential relationship during read-out in the nonvolatile semiconductor memory according to the fifth embodiment of the present invention;

FIG. 22 is a diagram illustrating a potential relationship during erase in the nonvolatile semiconductor memory according to the ninth embodiment of the present invention;

DETAILED DESCRIPTION OF THE INVENTION

Figure 1:
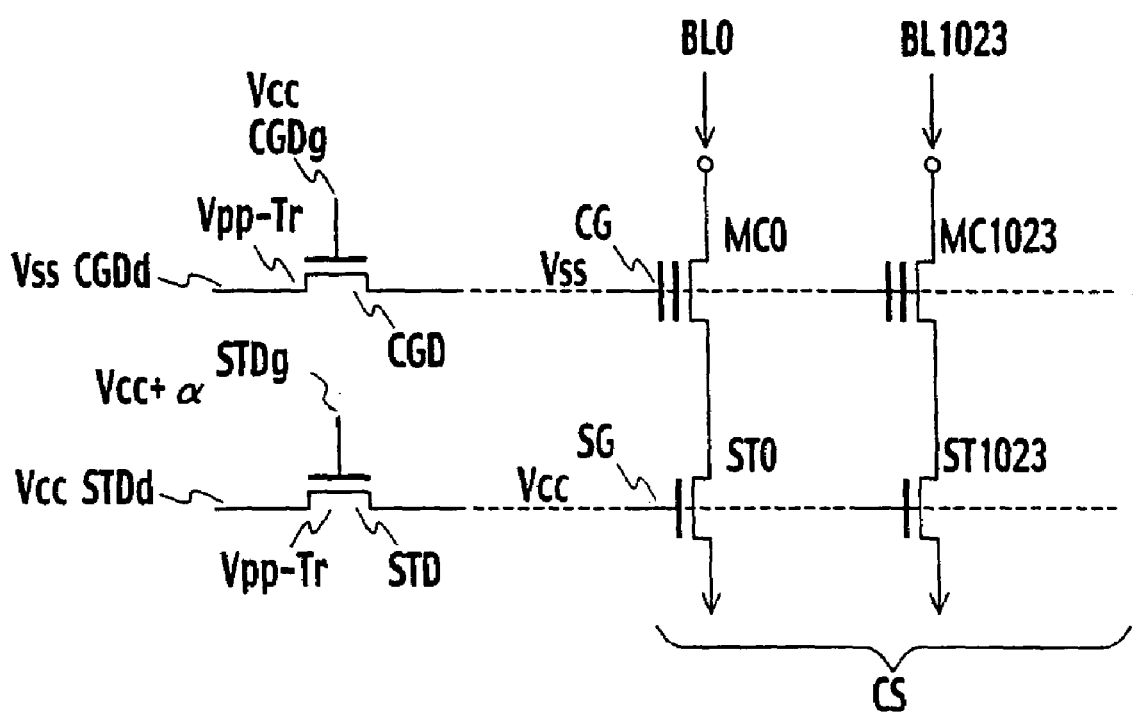
FIG. 1 is a schematic circuit diagram illustrating a potential relationship during read-out in a nonvolatile semiconductor memory having a two-transistor cell structure according to a comparative example.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

The present invention provides a nonvolatile semiconductor memory that improves reading capability to a control gate line and high-speed read-out operations by forming a thinner gate oxide film of a gate line driver transistor for a select transistor in a memory sub array with a memory cell unit. The memory cell unit is configured with a memory cell with one floating gate and one select transistor connected in series.

The nonvolatile semiconductor memory has a memory sub array, which is configured with a memory cell having one floating gate and one select transistor connected in series; wherein the gate oxide film of a control gate line driver transistor is thicker than that of a gate line driver transistor for a select transistor, and all control gate lines are grounded during read-out.

The nonvolatile semiconductor memory according to exemplary embodiments of the present invention provides high-speed readable memory cells that can be erased by writing using an FN current and are effective for EEPROM mixed devices. More specifically, a memory circuit includes a memory sub array having a memory cell unit, which is configured with a memory cell having one floating gate and one select transistor connected in series, and a transistor having a gate oxide film of a gate line driver transistor (hereafter, referred to as STD) for a select transistor. The gate oxide film is thinner than that of a control gate line driver transistor (hereafter, referred to as CGD). The thinner gate oxide film of the gate line driver transistor for the select transistor improves the switching characteristics. As a result, the potential-voltage transfer capability through the gate line driver transistor to the select transistor (hereafter, referred to as ST) is much improved in a readout mode of operation, allowing high-speed read-out operations.

Embodiments of the present invention are described in detail forthwith while referencing the drawings. The same or similar symbols are applied to the same or similar parts throughout the appended drawings. In addition, the embodiments given forthwith illustrate devices and methods for embodying the technical idea of the present invention, and the technical idea of the present invention is not limited to the following. The technical idea of the present invention may be modified within the scope of the appended claims.

COMPARATIVE EXAMPLE

As an comparative example, the circuit structure with a one-memory cell—one-transistor structure having a memory cell unit 150, which is configured with one memory cell and one select transistor connected in series, is made up of, as shown in FIG. 1, memory cell transistors MC0 through MC1023, select transistors ST0 through ST1023, a control gate line driver transistor CGD connected to a control gate line CG for the memory cell transistors MC0 through MC1023, and a gate line driver transistor STD connected to a gate line SG for the select transistors ST0 through ST1023. Furthermore, the drains of the memory cell transistors MC0 through MC1023 are connected to bit lines BL0 through BL1023, respectively, and the sources of the select transistors ST0 through ST1023 are connected to a common source line contact CS, respectively.

In the memory sub array having one-memory cell—one-select transistor structure, the gate line driver transistor STD for the select transistors ST0 through ST1023 and the control gate line driver transistor CGD have been formed with transistors having a thick gate oxide film (approximately 40 nm) and a breakdown gate voltage of approximately 30 V (hereafter, referred to as $V_{pp}$-Tr). As a result, there is a problem in that the read-out speed is limited due to the switching characteristics of the gate line driver transistor STD for the select transistors ST0 through ST1023, resulting in difficulty for high-speed read-out operations.

[First Embodiment]

Figure 2:
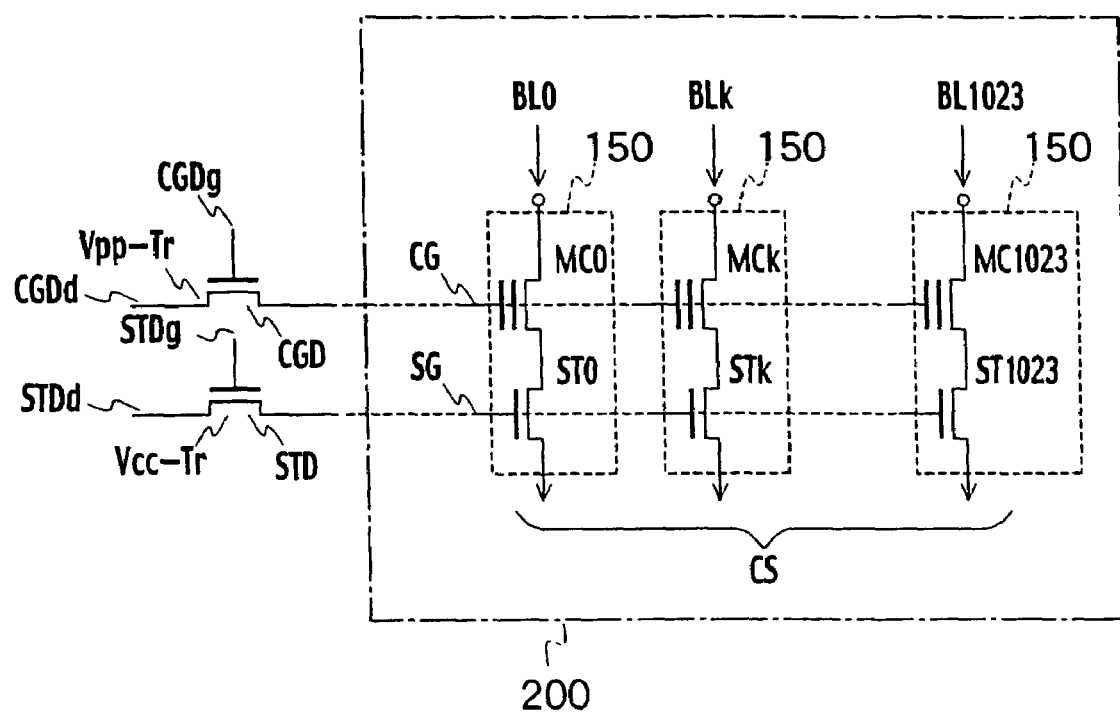
FIG. 2 shows a layout of a memory circuit of a nonvolatile semiconductor memory according to a first embodiment of the present invention.

A nonvolatile semiconductor memory according to the first embodiment of the present invention, as shown in the schematic circuit structure of FIG. 2, has a memory sub array 200, which includes a plurality of memory cell units 150 configured with a memory cell MC and a select transistor ST connected in series, a control gate line driver transistor CGD, and a select transistor gate line driver transistor STD. More specifically, the semiconductor memory is implemented by a plurality of memory cell transistors MC0 through MC1023, a plurality of select transistors ST0 through ST1023, a control gate line CG, a select transistor gate line driver transistor STD, a select transistor gate line SG, a plurality of bit lines BL0 through BL1023 connected to the respective drains of the memory cell transistors MC0 through MC1023, and a common source contact CS connected to the sources of the select transistors ST0 through ST1023. Predetermined voltage pulses are applied to the drain CGDd and the gate CGDg of the control gate line driver transistor CGD, respectively. Similarly, predetermined voltage pulses are applied to the drain STDd and the gate STDg of the select transistor gate line driver transistor STD, respectively. A transistor with a gate oxide film of approximately 40 nm thickness and approximately a 30 V breakdown gate voltage (hereafter, referred to as $V_{pp}$-Tr) is used as the control gate line driver transistor CGD. In addition, a transistor with a gate oxide film of approximately 10 nm thickness and an approximately 9 V breakdown gate voltage (hereafter, referred to as $V_{cc}$-Tr) is used as the select transistor gate line driver transistor STD.

Figure 3:
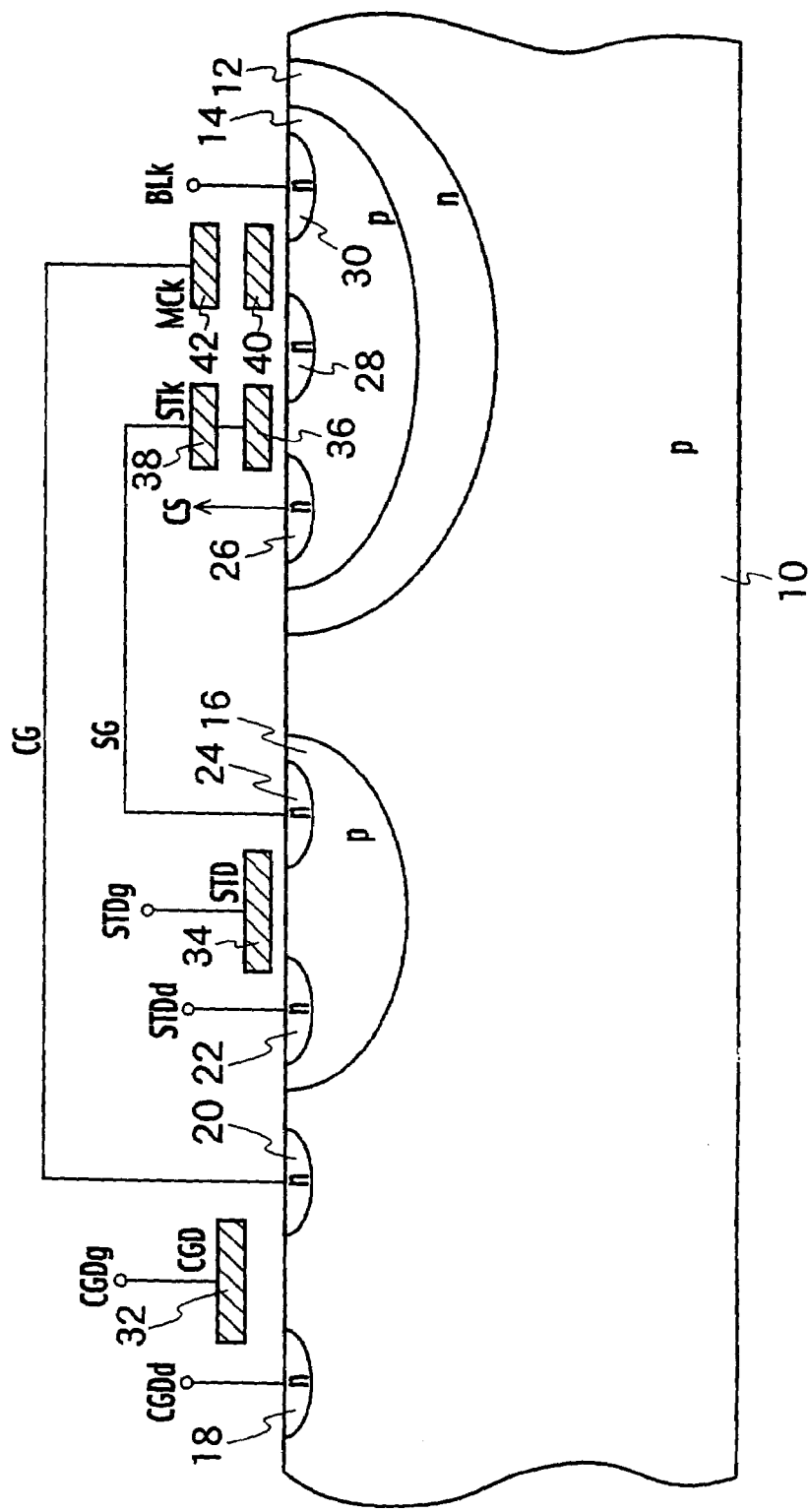
FIG. 3 is a cross-sectional view corresponding to FIG. 2.

The schematic cross-sectional device structure corresponding to FIG. 2 has, as shown in FIG. 3, a p-semiconductor substrate 10, an n-well diffusion region 12, p-well diffusion regions 14 and 16, n-diffusion layers 18, 20, 22, 24, 26, 28, and 30, a gate electrode 32 for the control gate line driver transistor CGD, a gate electrode 34 for the select transistor gate line driver transistor STD, commonly connected gate electrodes 36 and 38 for the select transistor STk, a floating gate electrode 40 and a control gate electrode 42 for the memory cell transistor MCk. The gate oxide film of the control gate line driver transistor CGD is made thicker than that of the select transistor gate line driver transistor STD.

Figure 4:
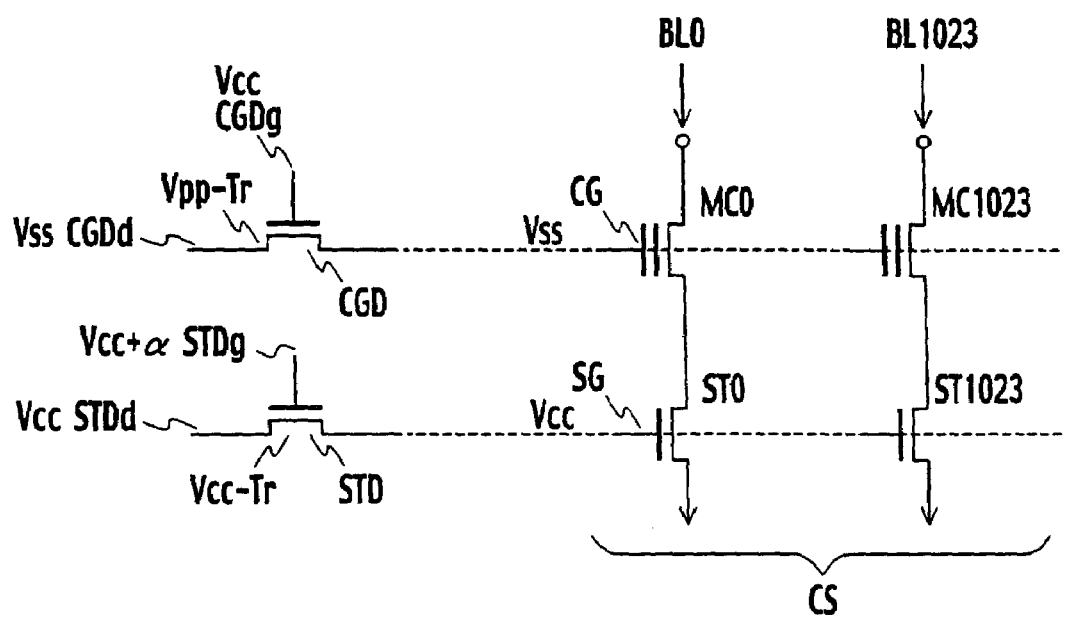
FIG. 4 is a circuit diagram illustrating a potential relationship during read-out in two transistor cells of the nonvolatile semiconductor memory according to the first embodiment of the present invention.

FIG. 4 shows voltage values applied to each element in the schematic circuit diagram corresponding to FIG. 2. Application of the same voltage pulses as the power supply voltage $V_{cc}$ to the gate CGDg of the control gate line driver transistor CGD allows the drain CGDd of the control gate line driver transistor CGD and the control gate line CG to be kept at the same source voltage $V_{ss}$. Application of the voltage pulses $V_{cc}+\alpha$, which are larger than the power supply voltage $V_{cc}$ by the threshold $\alpha$, to the gate STDg of the select transistor gate line driver transistor STD allows the drain STDd of the select transistor gate line driver transistor STD and the select transistor gate line SG to be kept at the same source voltage $V_{cc}$.

FIGS. 4 through 6 show the potential relationships during erase, write-in, and read-out, respectively, in the nonvolatile semiconductor memory according to the first embodiment of the present invention. Therein, $V_{cc}$ denotes the power supply voltage, which is 3 V or approximately 1.8 V for a low-voltage device. $V_{ss}$ denotes a source voltage, which is normally 0 V. $V_{pp\_erase}$ denotes an erase voltage, and a specific numerical value thereof is a matter of design, but is normally 14 V to 24 V. $V_{fb}$ denotes the flatband voltage of a pn junction of the p-well region 14 and the n-diffusion layer 30 connected to the bit line BLk, which is approximately 0.7 V. $V_{pp\_erase2}$ and $V_{pp\_erase3}$ vary due to capacitive coupling of the p-well region and the control gate line CG, and capacitive coupling of the p-well region and the select transistor gate line SG, respectively. Since the capacitive coupling ratio is normally approximately 0.9, those values are approximately $0.9 \times V_{pp\_erase}$. $V_{pp\_prog}$ denotes the write-in voltage, and a specific numerical value thereof is a matter of design, but is normally 15 V to 24 V. $V_{pp\_prog1}$ is the sum of the write-in voltage $V_{pp\_prog}$ and the threshold voltage of the control gate line driver transistor CGD, which is 1 to 2 V higher than the write-in voltage $V_{pp\_prog}$. $V_{read}$ denotes the read-out voltage of the bit line, which is 1 to 2 V.

Figures 7, 8:
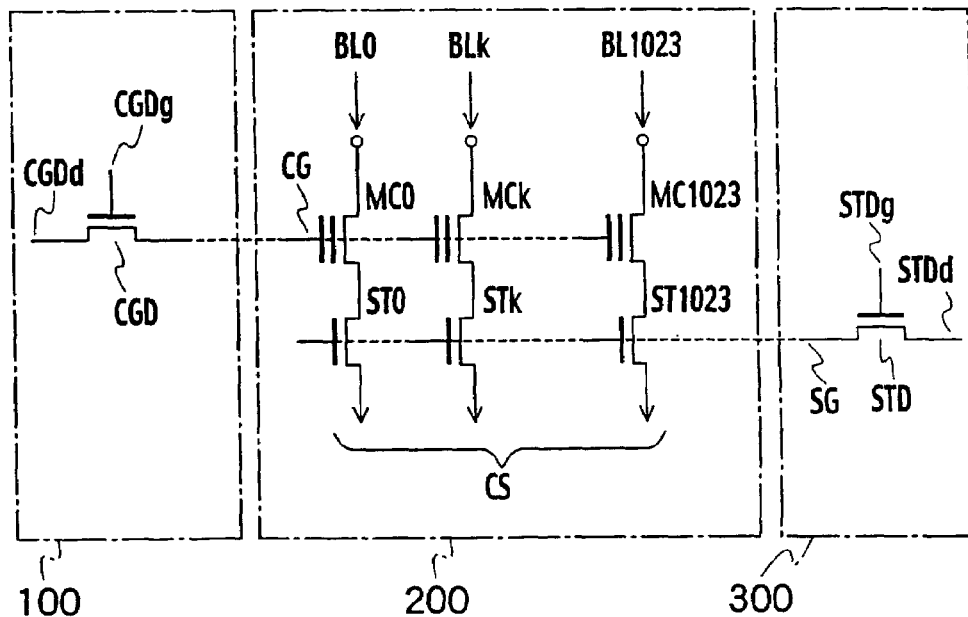
FIG. 7 is a diagram illustrating a potential relationship during read-out in the nonvolatile semiconductor memory according to the first embodiment of the present invention.
FIG. 8 shows a layout of a memory circuit of a nonvolatile semiconductor memory according to a second embodiment of the present invention.

As the potential relationships of FIGS. 4 and 5 indicate, erase and write-in operations are performed using the FN current. During read-out, as shown in FIG. 7, usage of the gate line driver transistor STD, which is for the select transistor ST, with a thinner gate oxide film than the gate oxide film of the control gate line driver transistor CGD, improves the switching characteristics. Therefore, the switching performance of the gate line driver transistor STD in the first embodiment of the present invention is much improved, as compared with the gate line driver transistor STD in the comparative example. As a result, the potential transfer speed to the select transistors ST0, . . . , STk, . . . , ST1023 during read-out is further improved compared to that of the memory circuit in the comparative example. In addition, during read-out, the potentials of all control gates CG are set to $V_{ss}$, turning on the select transistor SG for a to-be-read cell, and then the read-out operation is performed. As a result, the potential transfer speed of the control gate line driver transistor CGD does not affect the read-out speed. The above-discussed read-out method allows a higher-speed read-out operation than the memory circuit in the comparative example.

[Second Embodiment]

A nonvolatile semiconductor memory according to a second embodiment of the present invention, as shown in a circuit diagram of FIG. 8, has a memory sub array 200, a control gate line driver 100, which is deployed or located at one end of the memory sub array 200, and a select transistor gate line driver 300, which is deployed or located at the other end of the memory sub array 200. As shown in FIG. 8, a layout structure with the control gate line driver transistor CGD for a memory cell at one end of the memory sub array 200 and the select transistor gate line driver transistor STD at the other end allows separation of the gate CGDg of the control gate line driver transistor CGD to be applied to have a relatively high voltage $V_{cc}$ from the gate STDg of the select transistor gate line driver transistor STD and a relatively high voltage $V_{cc}+\alpha$, to be applied. This layout structure prevents an occurrence of interference during read-out.

[Third Embodiment]

Figure 9:
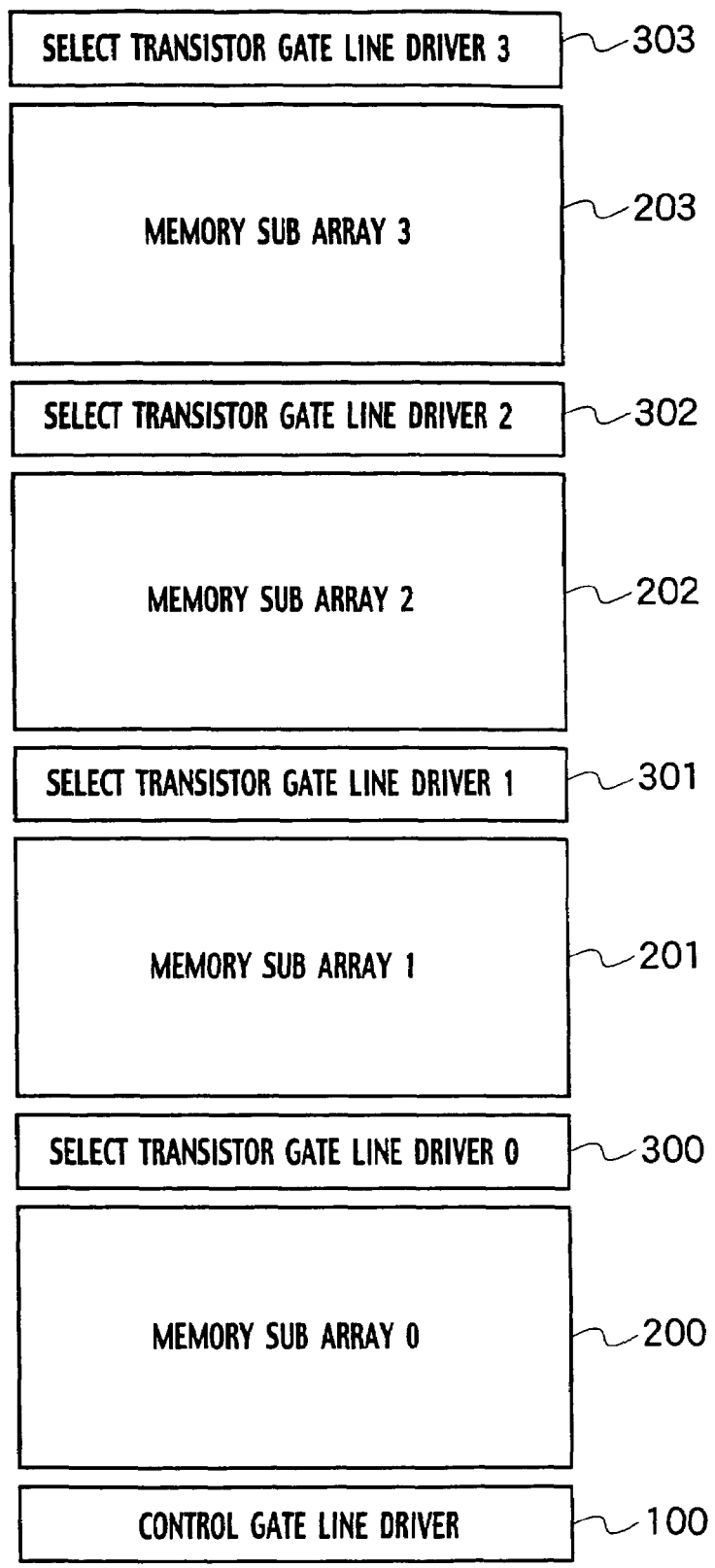
FIG. 9 shows a layout of a memory circuit of a nonvolatile semiconductor memory according to a third embodiment of the present invention.

A nonvolatile semiconductor memory according to a third embodiment of the present invention, as shown in the block diagram of FIG. 9, has a control gate line driver 100, four memory sub arrays 0 through 3 (200, 201, 202, and 203), and four select transistor gate line drivers 0 through 3 (300, 301, 302, and 303). FIG. 9 shows a layout diagram of one control gate line driver transistor CGD commonly driving the control gate line CG in the four memory sub arrays 200 through 203, and one select transistor gate line driver transistor STD driving a gate line SG in one memory sub array.

The nonvolatile semiconductor memory according to the third embodiment of the present invention has a simpler circuit structure than the circuit structure of the second embodiment.

As shown in FIG. 8, the circuit structure of the second embodiment includes the control gate line driver 100 and the select transistor gate line driver 300 for each memory sub array 200. On the other hand, as shown in FIG. 9, the circuit structure of the third embodiment includes the common control gate line driver 100 for four memory sub arrays 200–203 and the select transistor gate line driver 300–303 for each memory sub arrays 200–203, respectively. Each memory sub array 200–203 in FIG. 9 has a same circuit representation of the memory sub array 200 as shown in FIG. 8.

Furthermore, with reference to FIG. 8, during read-out, the potential voltages of all control gate lines CG are set to $V_{ss}$, turning on the select transistor ST for a to-be-read cell, and then the read-out operation is performed. As a result, the voltage potential transfer delay through the control gate line driver transistor CGD and the potential transfer delay, due to the gate line resistance caused by extension of the control gate line CG, do not affect the read-out speed. Accordingly, deployment of a select transistor gate line driver 300–303 for each memory sub array 200–203 allows formation of a shorter select transistor gate line SG. In addition, reduction in the voltage potential transfer delay, caused by the select transistor gate line SG resistance, allows further reduction in the read-out time period. Furthermore, since only one control gate line driver 100 can drive a plurality of memory sub arrays 200 through 203, the position of the control gate line driver 100 allows drastic reduction in the circuit device layout space, resulting in improved integration.

[Fourth Embodiment]

Figure 10:
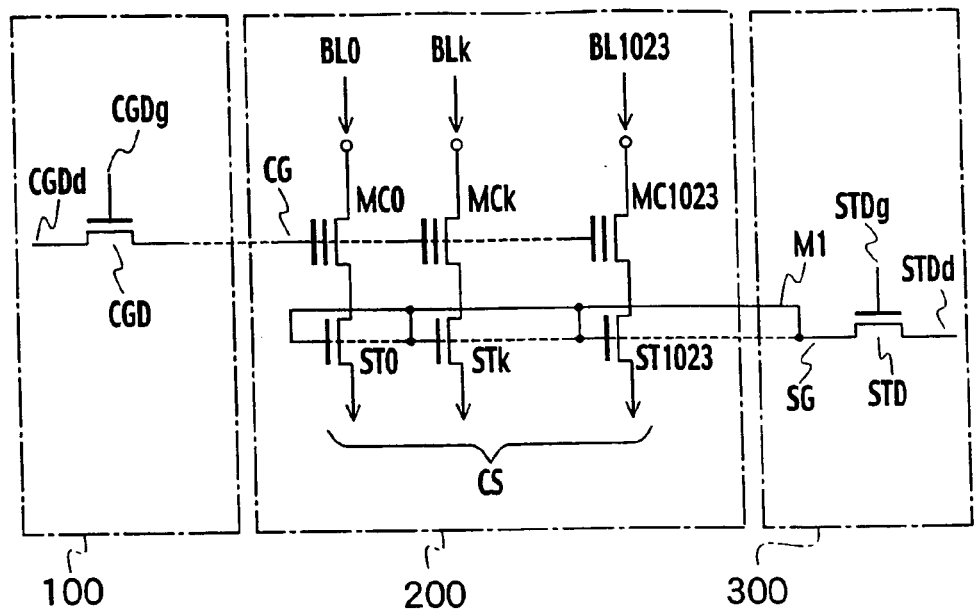
FIG. 10 shows a layout of a memory circuit of a nonvolatile semiconductor memory according to a fourth embodiment of the present invention.

A nonvolatile semiconductor memory according to a fourth embodiment of the present invention, as shown in a circuit diagram of FIG. 10, is characterized by the configuration of a control gate line driver 100, a memory sub array 200, and a select transistor gate line driver 300, and further, a gate line SG for the select transistors ST0 through ST1023 being short-circuited by an upper layer metal wiring M1, thereby having low resistance. In this case, the metal wiring M1 is made of aluminum or the like. Deployment of the above-mentioned metal wiring M1 at the upper layer of the gate line SG for the select transistors ST0 through ST1023 reduces delay caused by to the resistance of the gate line SG.

Usage of the gate line driver transistor STD, which is for the select transistor ST, with a thinner gate oxide film than the gate oxide film of the control gate line driver transistor CGD improves the switching characteristics of the gate line driver transistor STD. As a result, decreasing the resistance of the above-mentioned gate line SG further improves the potential transfer speed to the select transistors ST0, ..., STk, ..., ST1023 during read-out, resulting in a higher-speed read-out operation.

[Fifth Embodiment]

Figure 11:
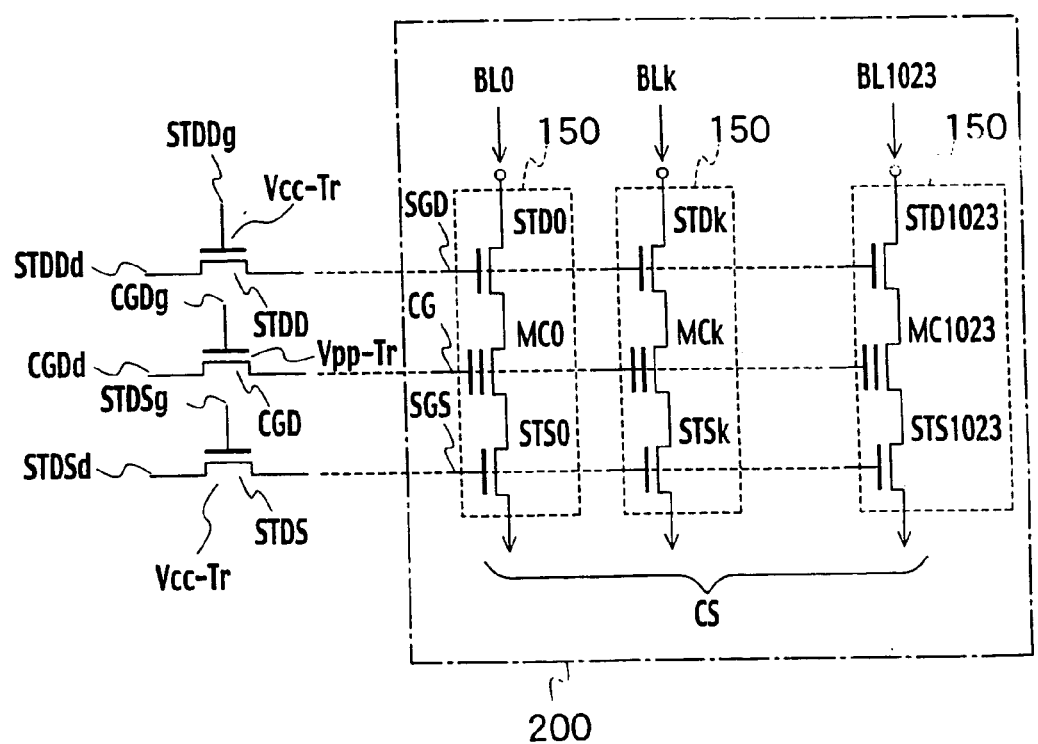
FIG. 11 shows a layout of a memory circuit of a nonvolatile semiconductor memory according to a fifth embodiment of the present invention.

A nonvolatile semiconductor memory according to a fifth embodiment of the present invention, as shown in a schematic circuit structure of FIG. 11, has a memory sub array 200 with a memory cell unit 150, which is configured with one memory cell MC and two select transistors STD, STS connected in series, a control gate line driver transistor CGD, and select transistor gate line driver transistors STDD and STDS. More specifically, the semiconductor memory has a plurality of memory cell transistors MC0 through MC1023, a plurality of drain side select transistors STD0, ..., STDk, ..., STD1023, a plurality of source side select transistors STS0, ..., STSk, ..., STS1023, a control gate line CG, select transistor gate line driver transistors STDD and STDS, select transistor gate lines SGD and SGS, a plurality of bit lines BL0 through BL1023 connected to the respective drains of the memory cell transistors MC0 through MC1023, and common source contact CS connected to sources of the source select transistors STS0, ..., STSk, ..., STS1023. Predetermined voltage pulses are applied to the drain CGDd and the gate CGDg of the control gate line driver transistor CGD, respectively. Similarly, predetermined voltage pulses are applied to the drain STDDd and the gate STDDg of the gate line driver transistor STDD for the drain side select transistors, respectively. Similarly, predetermined voltage pulses are applied to the drain STDSd and the gate STDSg of the gate line driver transistor STDS for the source side select transistors, respectively. A transistor with a gate oxide film of approximately 40 nm thickness and an approximately 30 V breakdown gate voltage ($V_{pp}$–Tr) is used as the control gate line driver transistor CGD. In addition, a transistor with a gate oxide film with approximately 10 nm thickness and approximately 9 V breakdown gate voltage (hereafter, referred to as $V_{cc}$–Tr) is used as the select transistor gate line driver transistors STDD and STDS.

Figure 18:
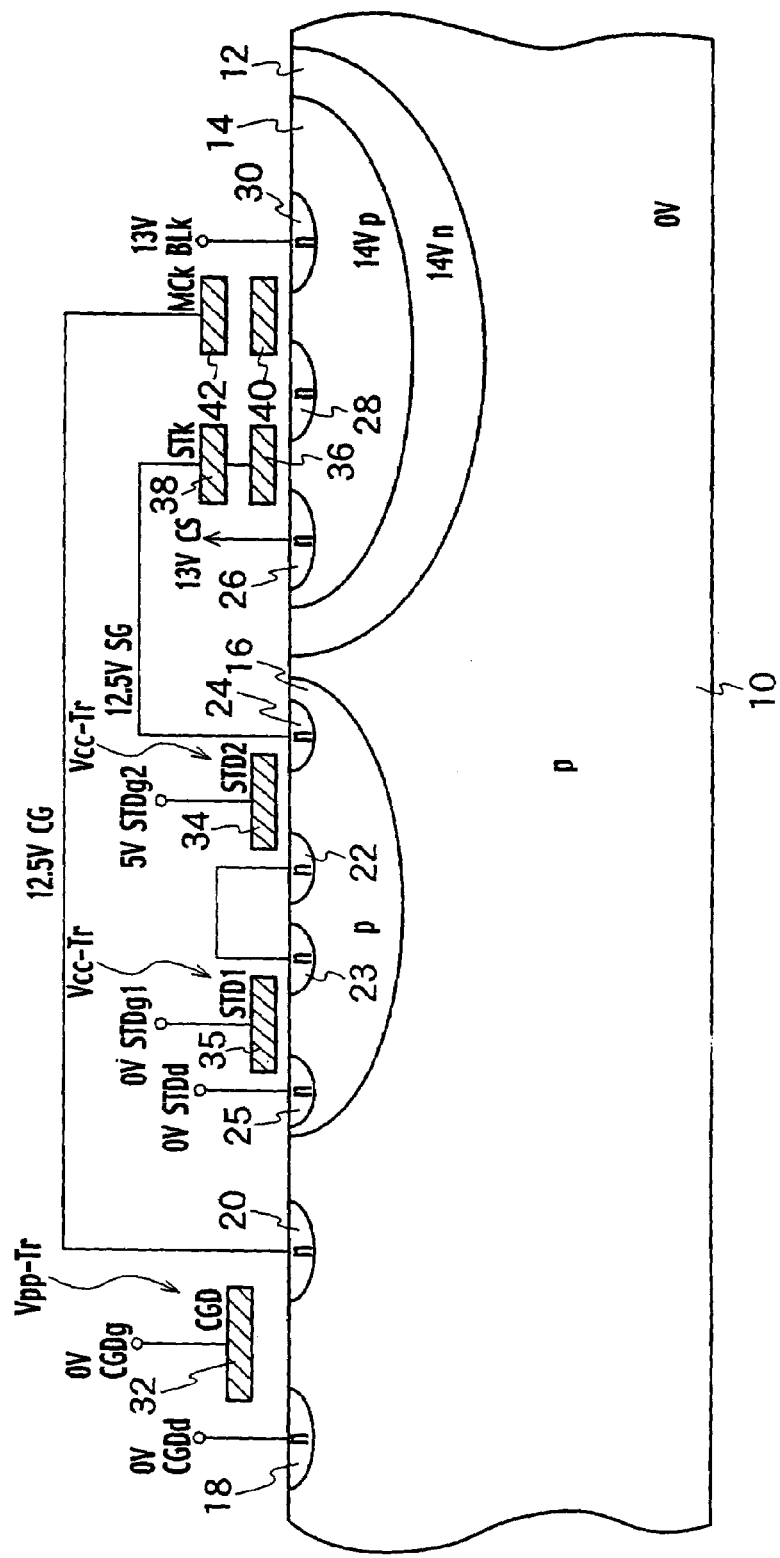
FIG. 18 is a schematic cross-sectional device structure illustrating potentials of an unselected block during erase in the nonvolatile semiconductor memory according to the eighth embodiment of the present invention.

FIGS. 11 through 13 show the potential relationships during erase, write-in, and read-out, respectively, in the nonvolatile semiconductor memory according to the fifth embodiment of the present invention. $V_{cc}$ denotes the power supply voltage, which is 3 V or approximately 1.8 V for a low-voltage device. $V_{ss}$ denotes the source voltage, which is normally 0 V. $V_{pp\_erase}$ denotes the erase voltage, and a specific numerical value is a matter of design but is normally 14 V to 24 V. $V_{fb}$ denotes the flatband voltage of a pn junction of the p-well region 14 and the n-diffusion layer 30 connected to the bit line BLk, as shown in FIG. 18 to be described later, which is approximately 0.7 V. $V_{pp\_erase2}$ and $V_{pp\_erase3}$ vary due to capacitive coupling of the p-well region and the control gate line CG, and capacitive coupling of the p-well region and the source side select transistor gate line SGS, respectively. Since the capacitive coupling ratio is normally approximately 0.9, those values are approximately $0.9 \times V_{pp\_erase}$. $V_{pp\_prog}$ in FIG. 13 denotes the write-in voltage, and a specific numerical value is a matter of design but is normally 15 V to 24 V. $V_{pp\_prog1}$ is represented by the sum of the write-in voltage $V_{pp\_prog}$ and the threshold voltage of the control gate line driver transistor CGD, which is 1 to 2 V higher than the write-in voltage $V_{pp\_prog}$. $V_{read}$ in FIG. 14 denotes the read-out voltage for the bit line, which is 1 to 2 V.

As the potential relationships of FIGS. 11 and 12 indicate, erase and write-in operations are performed using the FN current. During read-out operation, as shown in FIG. 14, usage of the gate line driver transistors STDD and STDS, which are for the select transistors STD0 through STD1023 and STS0 through STS1023, with a thinner gate oxide film than the gate oxide film of the control gate line driver transistor CGD improves the switching characteristics. As a result, the potential transfer speed to the select transistors STD0 through STD1023 and STS0 through STS1023 during read-out is further improved compared to the memory circuit in the comparative example. Furthermore, during read-out, the voltages for all control gates CG are set to $V_{ss}$ to transfer $V_{cc}$ to the select transistor SG gate line for a to-be-read cell, turning on the select transistor SG for that cell, and then the read-out operation is performed. As a result, the potential transfer speed of the control gate line driver transistor CGD does not affect the read-out speed. The above-discussed read-out method allows a higher-speed read-out operation than the memory circuit as compared with the comparative example.

[Sixth Embodiment]

Figure 15:
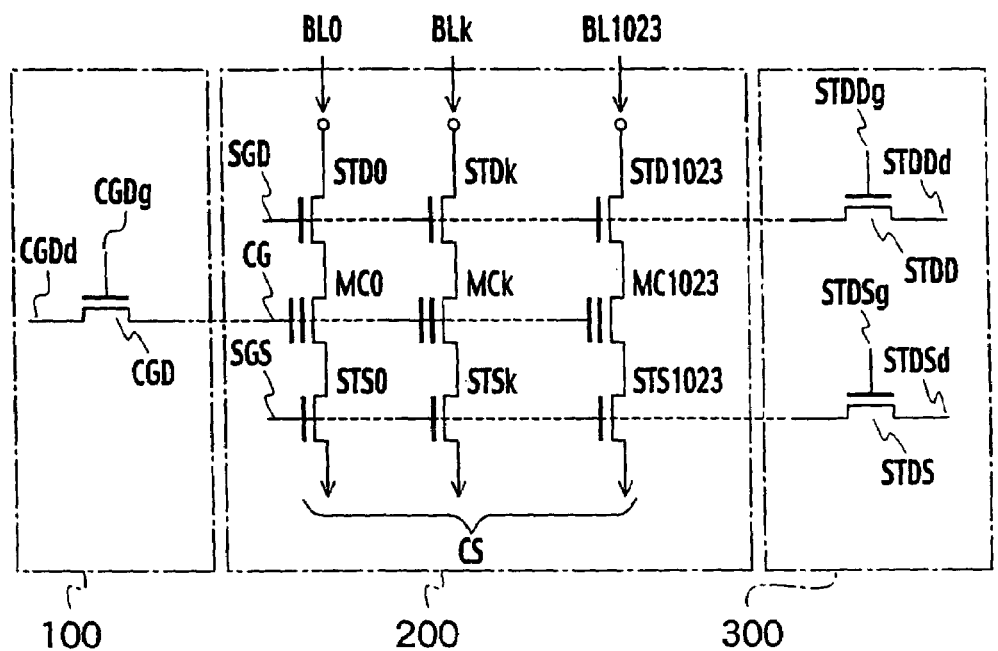
FIG. 15 shows a layout of a memory circuit of a nonvolatile semiconductor memory according to a sixth embodiment of the present invention.

A nonvolatile semiconductor memory according to a sixth embodiment of the present invention, as shown in a circuit diagram of FIG. 15, has a memory sub array 200, a control gate line driver 100, which is deployed at one end of the memory sub array 200, and a select transistor gate line driver 300, which is deployed at the other end of the memory sub array 200. As shown in FIG. 15, a layout structure locates the control gate line driver transistor CGD for a memory cell at one end of the memory sub array 200 and the select transistor gate line driver transistors STDD and STDS at the other end of the memory sub array 200. The layout structure as shown in FIG. 15 allows separation of the gate CGDg of the control gate line driver transistor CGD from the gates STDDg and STDSg of the select transistor gate line driver transistors STDD and STDS. A relatively high voltage $V_{cc}$ is applied to the gate CGDg of the control gate line driver transistor CGD. In the same way, a relatively high voltage $V_{cc}+\alpha$ is applied to the gate STDDg and STDSg of the control gate line driver transistors STDD and STDS, respectively. The layout structure as shown in FIG. 15 prevents an occurrence of an interference due to capacitive coupling during a read-out mode of operation.

[Seventh Embodiment]

Figure 16:
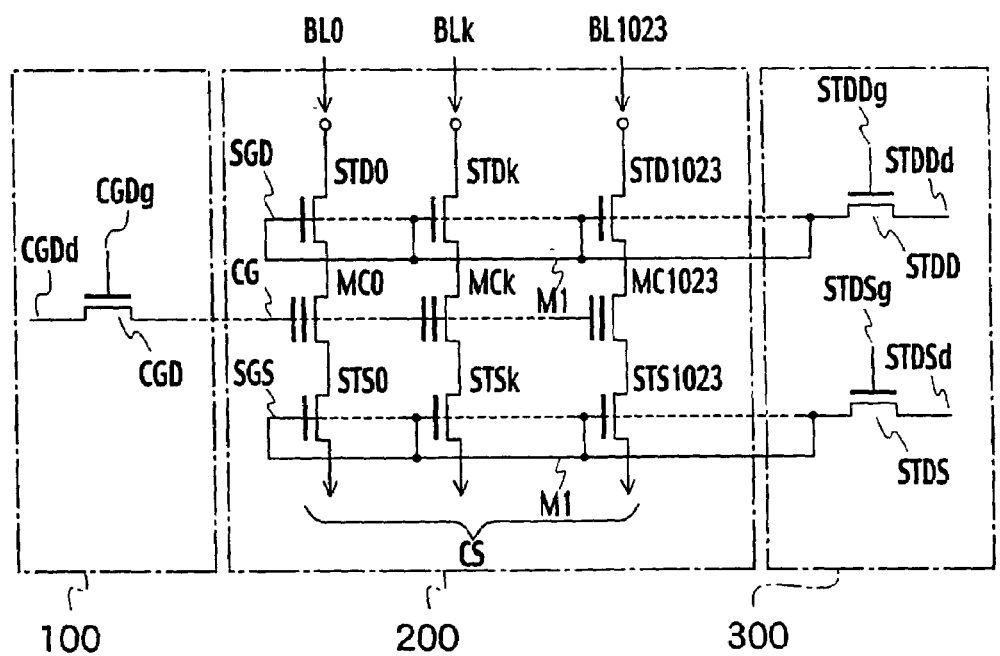
FIG. 16 shows a layout of a memory circuit of a nonvolatile semiconductor memory according to the seventh embodiment of the present invention.

A nonvolatile semiconductor memory according to a seventh embodiment of the present invention, as shown in a circuit diagram of FIG. 16, is characterized by the configuration of a control gate line driver 100, a memory sub array 200, and a select transistor gate line driver 300 and a gate line SGD for the select transistors STD0 through STD1023. The device further includes a gate line SGS of the select transistors STS0 through STS1023 being short-circuited by an upper layer metal wiring M1 to thereby having a low resistance. In this case, the metal wiring M1 is made of aluminum or the like. Deployment of the above-mentioned metal wiring M1 at the upper layer of the gate lines SGD and SGS for the select transistors STD0 through STD1023 and STS0 through STS1023 allows reduction in the delay, due to the resistance of the gate lines SGD and SGS.

Usage of the gate line driver transistors STDD and STDS, which are for the select transistor ST, with a thinner gate oxide film than the gate oxide film of the control gate line driver transistor CGD, allows improves the switching characteristics of the gate line driver transistors STDD and STDS. As a result, decreasing the resistance of the above-described gate line SG further improves the potential transfer speed to the select transistors STD0, . . . , STDk, . . . , STD1023 and STS0, . . . , STSk, . . . , STS1023 during read-out, resulting in a higher-speed read-out operation.

[Eighth Embodiment]

Figure 17:
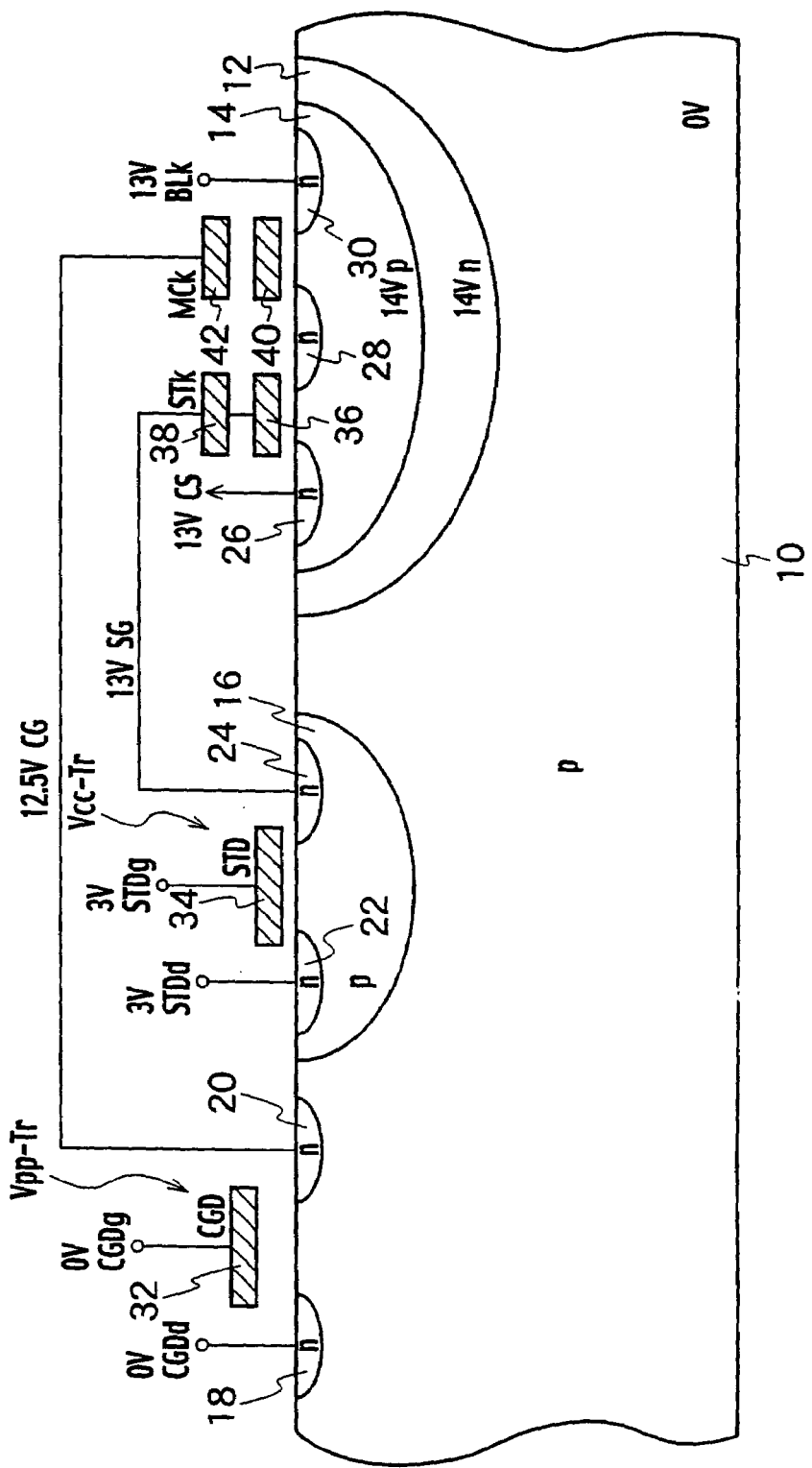
FIG. 17 is a schematic cross-sectional device structure illustrating potentials in an unselected block during erase as a comparative example of an eighth embodiment of the present invention.

FIG. 17 is a schematic cross-sectional device structure illustrating potentials in an unselected block during erase as a comparative example of an eighth embodiment of the present invention. FIG. 18 is a schematic cross-sectional device structure illustrating potentials of an unselected block during erase in the nonvolatile semiconductor memory according to the eighth embodiment of the present invention;

FIG. 17 is a diagram showing the potential of each portion in an unselected block during erase in the schematic cross-sectional device structure of the nonvolatile semiconductor memory according to the first embodiment of the present invention, shown in FIG. 3. As shown in FIG. 17, 0 V is applied to the p-semiconductor substrate 10, 14 V is applied to the p-well region 14, 14 V is applied to the n-well region 12, 0 V is applied to the gate CGDg of the control gate line driver transistor CGD, 3 V is applied to the gate STDg and 3 V is applied to the drain STDd of the select transistor gate line driver transistor STD. As a result, capacitive coupling induces the same voltage of 13 V in the bit line BLk, the control gate line CG, and the select transistor gate line SG, respectively. As seen in FIG. 17, in the case of the nonvolatile semiconductor memory according to the first embodiment, approximately 10 V is applied between the n-diffusion layer 24 and the gate electrode 34 of the select gate line driver transistor STD during erase. Therefore, during erase, approximately 13 V voltage, at maximum, may be applied to the gate oxide film between the gate electrode 34 and the n-diffusion layer 24. As a result, there is a possibility of dielectric breakdown of the gate insulating film. To solve this problem, a measure for avoiding the dielectric breakdown of the gate insulating film by restricting the number of times for erase during an erase operation can be considered. In addition, in order to clearly avoid dielectric breakdown, the gate insulating film thickness $t_{ox}$ is set to approximately 40 nm since it is difficult to set that thickness to be extremely thin. Therefore, the current drive capability of the gate line driver transistor STD is relatively low, because of the relatively thick gate insulating film.

On the other hand, the nonvolatile semiconductor memory according to the eighth embodiment of the present invention, as shown in the schematic cross-sectional device structure of FIG. 18, is characterized in that the voltage applied to each transistor is set low by positioning two transistors STD1 and STD2 in series as the gate line driver transistors for the select transistor STk in the p-well region 16 and thereby dividing the high-voltage pulse. In addition, as shown in FIG. 18, in order to prevent application of a high voltage to the gate insulating film of the select gate line driver transistor STD, two stages select gate line driver transistors STD1 and STD2 are provided, and a voltage of approximately 5 V is applied to the gate STDg2 of the SG-side first stage transistor STD2 of the two stages of transistors STD1 and STD2. Decreasing the voltage-potential to be transferred to the second stage transistor STD1 to approximately $5-V_{th}$ by the SG-side first stage transistor STD2 prevents the dielectric breakdown of the gate insulating films of the select gate line driver transistors STD1 and STD2. FIG. 18 also shows the potential of each portion in an unselected block during erase in the schematic cross-sectional device structure of the nonvolatile semiconductor memory according to the eighth embodiment of the present invention. For example, as shown in FIG. 18, 0 V is applied to the p-semiconductor substrate 10, 14 V is applied to the p-well region 14, 14 V is applied to the n-well region 12, 13 V is applied to the bit line BLk, 0 V is applied to the gate CGDg of the control gate line driver transistor CGD, 0 V is applied to the gate STDg1, 0 V is applied to the drain STDd of the select transistor gate line driver transistor STD1, and 5 V is applied to the gate STDg2 of the STD2. As a result, capacitive coupling induces the same voltage of 12.5 V in the control gate line CG and the select transistor gate line SG, respectively.

According to the configuration of the semiconductor memory according to the eighth embodiment of the present invention, since voltages applied to the respective gate insulating films of the select gate line driver transistors STD1 and STD2, which have a bi-level serial connection structure, can be set low, the thickness of the gate insulating film $t_{ox}$ thereof can be set thin, and high-speed switching performance of the select gate line driver transistor STD can be achieved. In addition, the current drive capability with the select gate line driver transistor STD can be improved. As a result, the write/erasable number of times can be increased.

[Ninth Embodiment]

Figure 19:
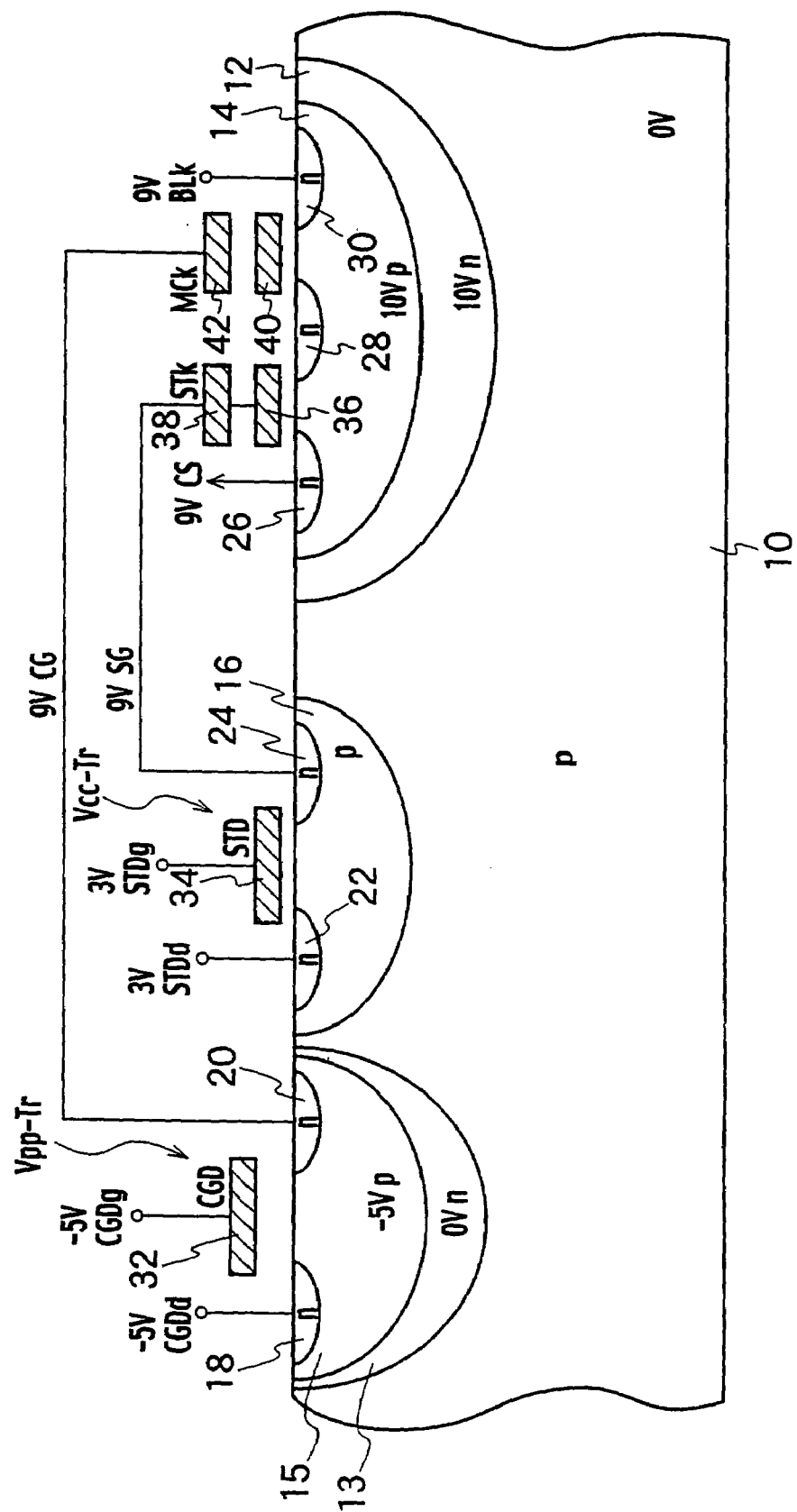
FIG. 19 is a schematic cross-sectional device structure illustrating potentials in an unselected block during erase when CGD is formed in a double well of a nonvolatile semiconductor memory according to a ninth embodiment of the present invention.
Figure 20:
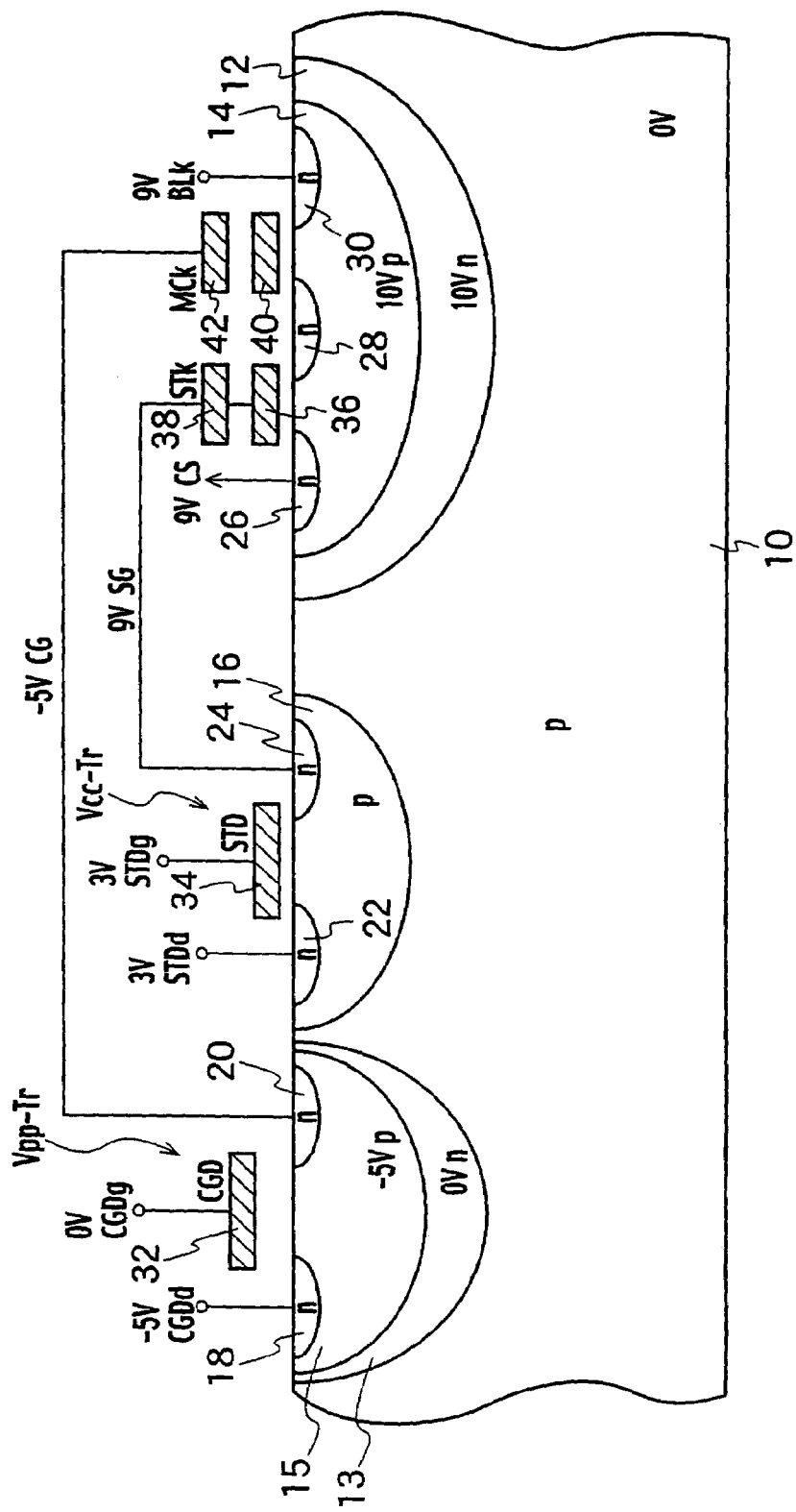
FIG. 20 is a schematic cross-sectional device structure illustrating potentials in an unselected block during erase when CGD is formed in a double well of the nonvolatile semiconductor memory according to the ninth embodiment of the present invention.

A nonvolatile semiconductor memory according to a ninth embodiment of the present invention, as shown in the schematic cross-sectional device structures of FIGS. 18 through 20, is characterized by a control gate line driver transistor CGD formed in a double well region, which is configured with the n-well region 13 and the p-well region 15. The control gate line driver transistor CGD is formed in the double well region for low-voltage operation. During erase, a negative bias voltage of approximately −5 V is applied to the drain CGDd of the control gate line driver transistor CGD, and the potentials of the n-well region 12 and the p-well region 14 in the memory cell array area are set low, approximately 10 V for erase. In this case, since the voltage applied between the n-diffusion layer 24 and the gate electrode 34 of the select gate line driver transistor STD is controlled to be approximately 7 V, the write/erasable number of times can be drastically increased.

Figure 21:
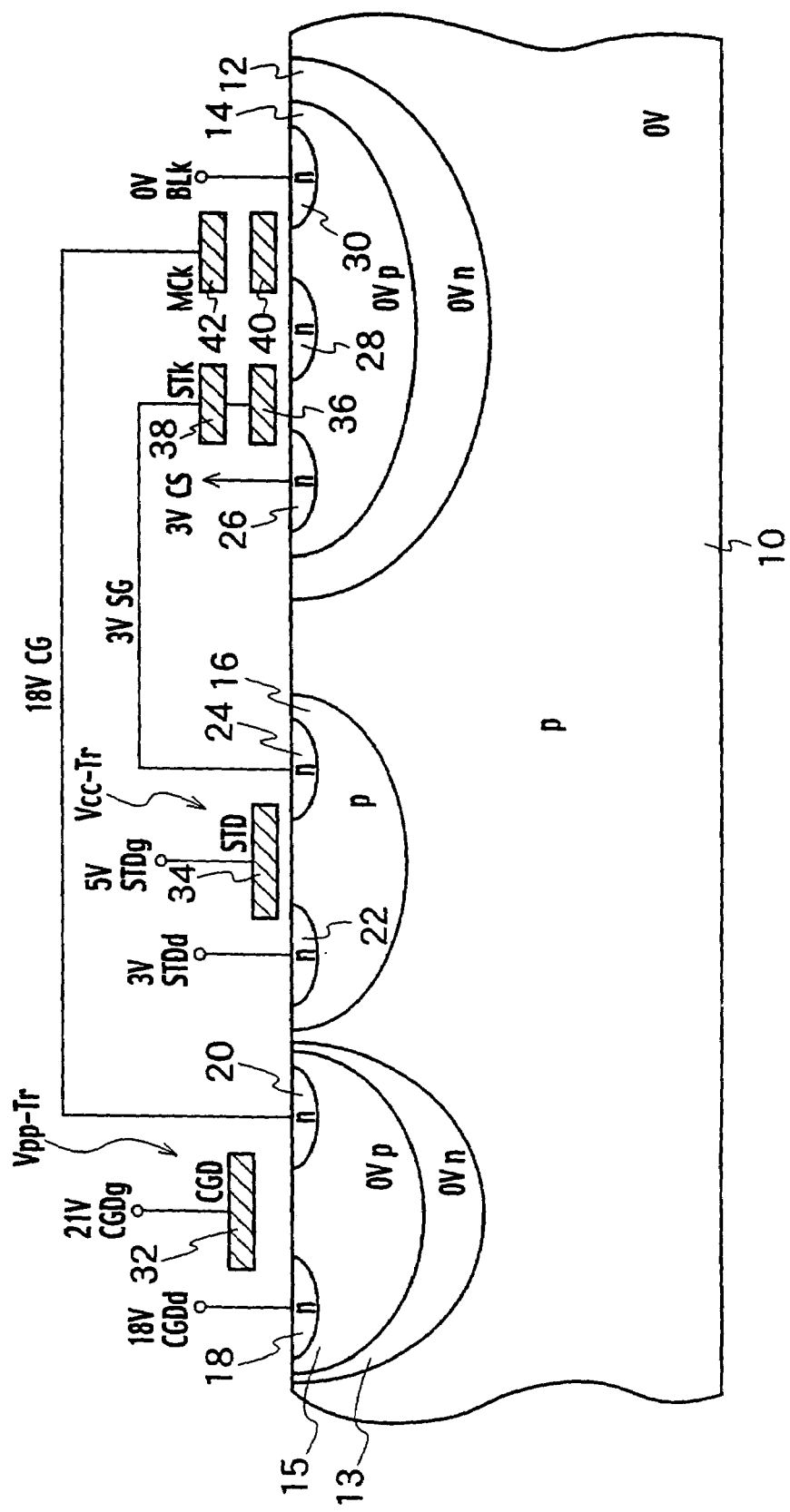
FIG. 21 is a schematic cross-sectional device structure illustrating potentials in an unselected block during erase when CGD is formed in a double well of the nonvolatile semiconductor memory according to the ninth embodiment of the present invention.

FIG. 19 shows the potential of each portion in an unselected block during erase. FIG. 20 shows the potential of each portion in the selected block during erase. FIG. 21 shows the potential of each portion in the selected block during write-in. FIG. 22 shows the potential relationships during erase.

As shown in FIG. 19, the potentials in the unselected block during erase are such that: for example, 0 V is applied to the p-semiconductor substrate 10, 10 V is applied to the p-well region 14, 10 V is applied to the n-well region 12, −5 V is applied to the gate CGDg and −5 V is applied to the drain CGDd of the control gate line driver transistor CGD, 3 V is applied to the gate STDg and 3 V is applied to the drain STDd of the select transistor gate line driver transistor STD, and 0 V and −5 V are applied to the n-well region 13 and the p-well region 15 in the double well region, respectively. As a result, capacitive coupling induces the same voltage of 9 V in the bit line BLk, the control gate line CG, and the select transistor gate line SG, respectively.

As shown in FIG. 20, the potentials in the selected block during erase are such that: for example, 0 V is applied to the p-semiconductor substrate 10, 10 V is applied to the p-well region 14, 10 V is applied to the n-well region 12, −5 V is applied to the control gate line CG, 0 V and −5 V are applied to the gate CGDg and the drain CGDd of the control gate line driver transistor CGD, respectively, 3 V is applied to the gate STDg and the drain STDd of the select transistor gate line driver transistor STD, and 0 V and −5 V are applied to the n-well region 13 and the p-well region 15 in the double well region, respectively. As a result, capacitive coupling induces the same voltage of 9 V in the bit line BLk and the select transistor gate line SG, respectively. The potential relationship shown in FIG. 20 discloses that erase for the floating gate electrode 40 of the memory cell transistor MCk is performed with the potential difference of approximately 15 V.

The nonvolatile semiconductor memory according to the ninth embodiment of the present invention has an advantage in that the write/erasable number of times can be increased, because the voltage applied to the gate STDg of the select transistor gate line driver transistor STD can be controlled to a low voltage, and the voltage applied to the gate insulating film between the gate electrode 34 and the n-diffusion layer 24 of the STD can also be a low voltage.

[Tenth Embodiment]

Figure 23:
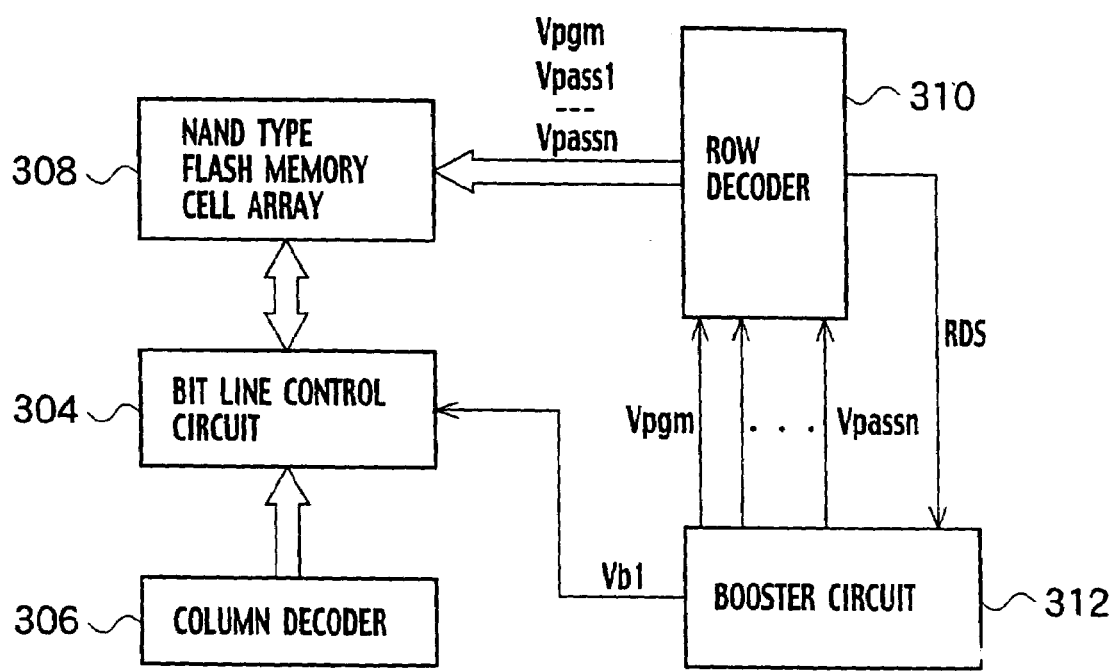
FIG. 23 is a system block diagram of a nonvolatile semiconductor memory according to a tenth embodiment of the present invention.

A nonvolatile semiconductor memory according to a tenth embodiment of the present invention, as shown in a system block configuration of FIG. 23, has a NAND flash memory cell array 308, a bit line control circuit 304, a row decoder 310, a column decoder 306, and a booster circuit 312. The nonvolatile semiconductor memory described in the first through ninth embodiments of the present invention is applicable to the NAND flash memory cell array 308. The bit line control circuit 304 and the row decoder 310 are connected to this NAND flash memory cell array 308. The bit line control circuit 304 latches to-be-written data, senses read-out data, or performs related operations. The column decoder 306, which is used to select a column of a NAND cell unit by decoding a column address signal, is connected to this bit line control circuit 304. The booster circuit 311 generates a write-in voltage $V_{pgm}$, different intermediate voltages $V_{pass1}$ through $V_{passn}$, and a bit line voltage $V_{b1}$ from the power supply voltage. The row decoder 310 supplies a control signal RDS to the booster circuit 312, and receives the write-in voltage $V_{pgm}$ and the intermediate voltages $V_{pass1}$ through $V_{passn}$. Note that the multiple intermediate voltages $V_{pass1}$ through $V_{passn}$ are voltages used during write-in, read-out, and erase of the nonvolatile semiconductor memory according to the embodiments of the present invention and are mainly applied to the word lines WL1 through WLn. This row decoder 310 decodes a row address signal, outputting the resulting decoded signals such as the write-in voltage $V_{pgm}$ and the intermediate voltages $V_{pass1}$ through $V_{passn}$ for selecting a memory cell transistor in the above-described NAND flash memory cell array 308, the voltage $V_{sgs}$ to be applied to the select gate line SGS, the voltage $V_{sgd}$ to be applied to the select gate line SGD, and the voltage $V_{s1}$ to be applied to the source line. These signals allow selection of a word line and a select gate line in the above-described NAND flash memory cell array 308. Furthermore, the bit line control circuit 304 receives the bit line voltage $V_{b1}$ from the booster circuit 312, and supplies it to the column of the NAND cell unit selected by the column decoder 306. Note that FIG. 23 shows only the minimum circuit configuration, although an address buffer, a data input/output buffer, and a timing generation circuit are actually required. However, descriptions of the other elements are omitted for simplicity.

[Eleventh Embodiment]

Roughly classified, there are three operation modes of a nonvolatile semiconductor memory according to the embodiments of the present invention. These modes are called 'page mode', 'byte mode', and 'ROM region included EEPROM mode'.

Figure 24:
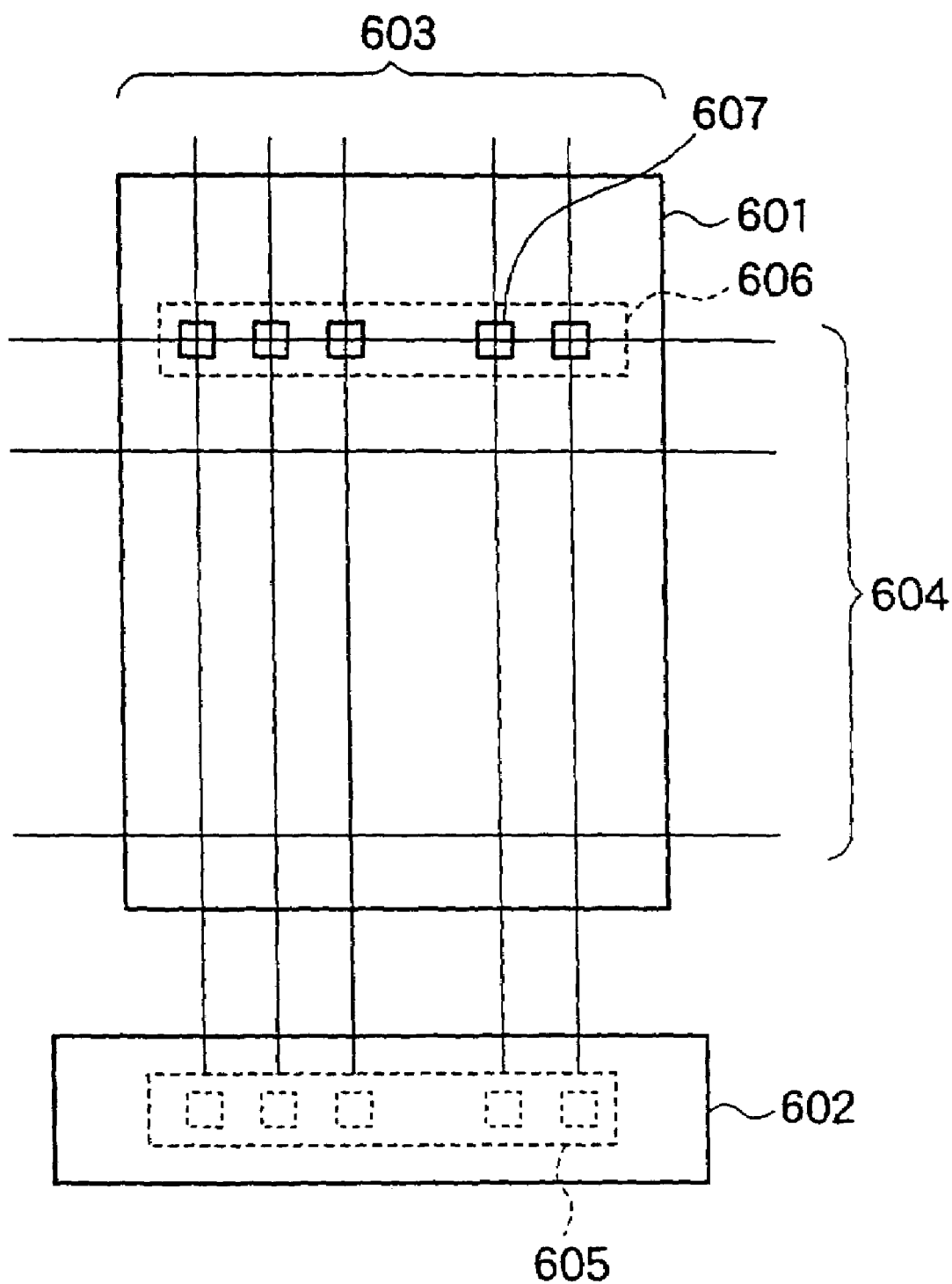
FIG. 24 is a schematic block diagram of page flash memory used in a nonvolatile semiconductor memory according to en eleventh embodiment of the present invention.

As shown in FIG. 24, the page mode collectively reads out via bit lines 603 a memory cell row 606, which is on a word line 604 in a flash memory cell array 601, which becomes a memory cell row 605 in sense amplifier 602, or collectively writes in from the sense amplifier 602. In other words, read-out/write-in operation is performed page-by-page. In FIG. 24, memory cells 607 are deployed at the intersections of the word lines 604 and the bit lines 603.

Figure 25:
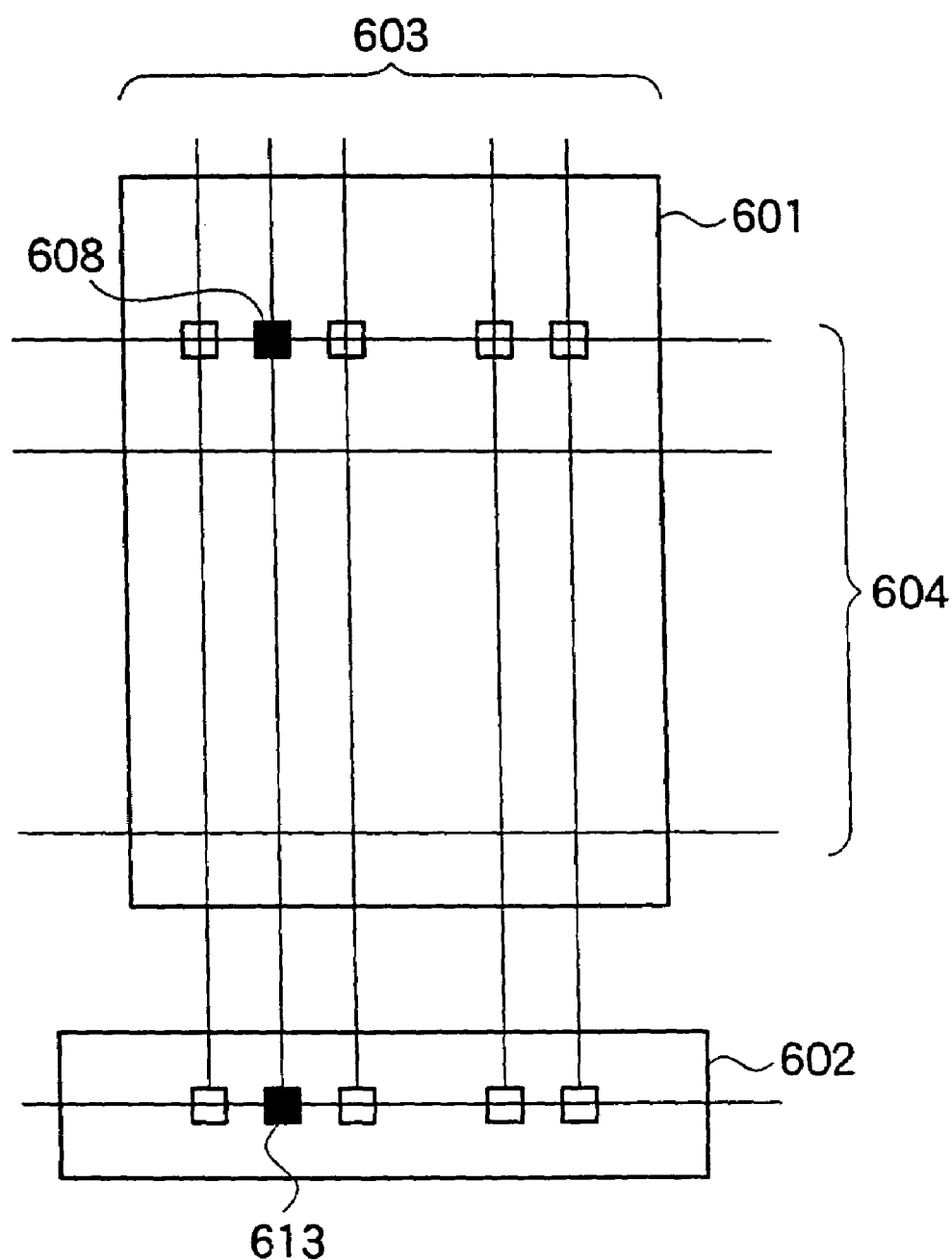
FIG. 25 is a schematic block diagram of byte flash memory used in the nonvolatile semiconductor memory according to the eleventh embodiment of the present invention.

In contrast, as shown in FIG. 25, the byte mode reads out byte-by-byte a memory cell 608, which is on the word line 604 in the flash memory cell array 601, which becomes a memory cell 613 in the sense amplifier 602, or writes in byte-by-byte from the memory cell 613 in the sense amplifier 602 to the memory cell 608. In other words, the byte mode is different from the page mode in that read-out/write-in operation is performed byte-by-byte.

Figure 26:
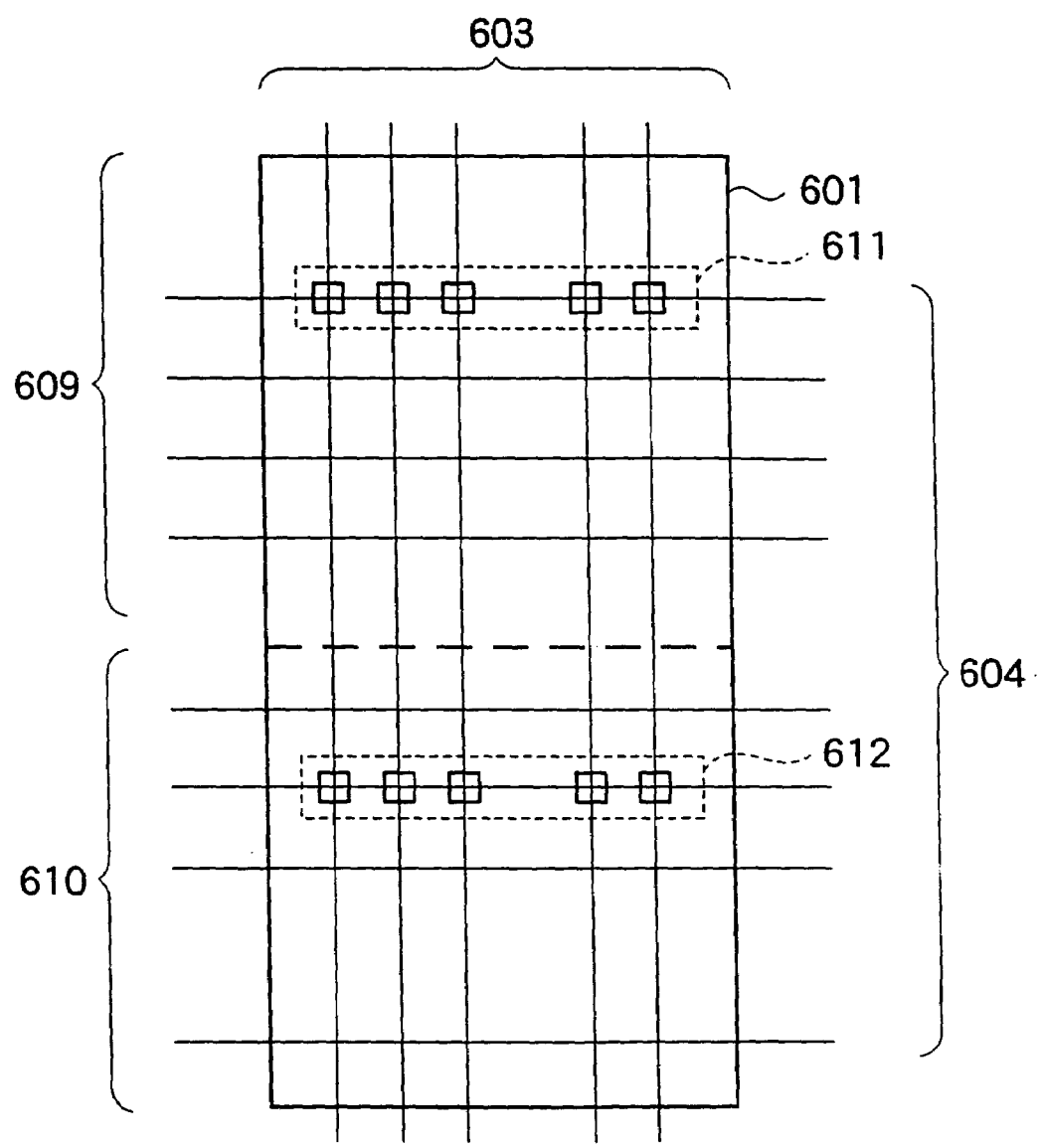
FIG. 26 is a schematic block diagram of ROM region included EEPROM flash memory used in the nonvolatile semiconductor memory according to the eleventh embodiment of the present invention.

The ROM region included EEPROM mode performs, as shown in FIG. 26, operations of reading out information from the flash memory cell array 601 page-by-page, or, byte-by-byte, and rewriting the information while systematically switching a ROM region included EEPROM 610 section, which is provided by partitioning the flash memory cell array 601 into that ROM region included EEPROM 610 section and a flash memory 609 section. An example where a memory cell row 611 on the same word line in the flash memory 609 is read out or written in a page unit in place of a memory cell row 612 in the ROM region included EEPROM 610 is shown in FIG. 26.

[Twelfth Embodiment]

Various application examples are possible with the nonvolatile semiconductor memory according to the first through eleventh embodiments of the present invention. Some of those application examples are shown in FIG. 27 through FIG. 40.

(Memory Card)

APPLICATION EXAMPLE 1

Figure 27:
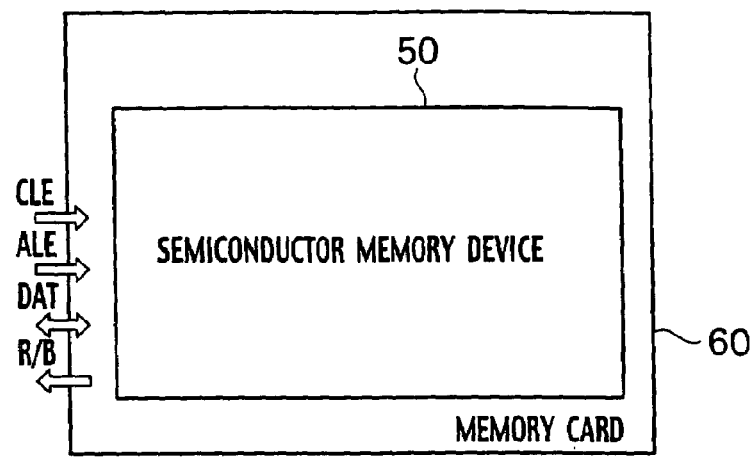
FIG. 27 is a schematic block diagram showing the internal configuration of a memory card to which is applied a nonvolatile semiconductor memory according to a twelfth embodiment of the present invention.

As an example, a memory card 60 including a semiconductor memory device 50 is configured as shown in FIG. 27. The nonvolatile semiconductor memory according to the first through eleventh embodiments of the present invention may be used for the semiconductor memory device 50. The memory card 60 is, as shown in FIG. 27, operable so as to receive a predetermined signal from an external device (not shown in the drawing) or to output a predetermined signal from an external device (not shown in the drawing).

A signal line DAT, a command line enable signal line CLE, an address line enable signal line ALE, and a ready/ busy signal line R/B are connected to the memory card 60, which includes the semiconductor memory device 50. The signal line DAT is used to transfer a data signal, an address signal, or a command signal. The command line enable signal line CLE is used to transmit a signal indicating that the command signal is being transferred over the signal line DAT. The address line enable signal line ALE is used to transmit a signal indicating that the address signal is being transferred over the signal line DAT. The ready/busy signal line R/B is used to transmit a signal indicating whether the semiconductor memory device 50 is ready or not.

APPLICATION EXAMPLE 2

Figure 28:
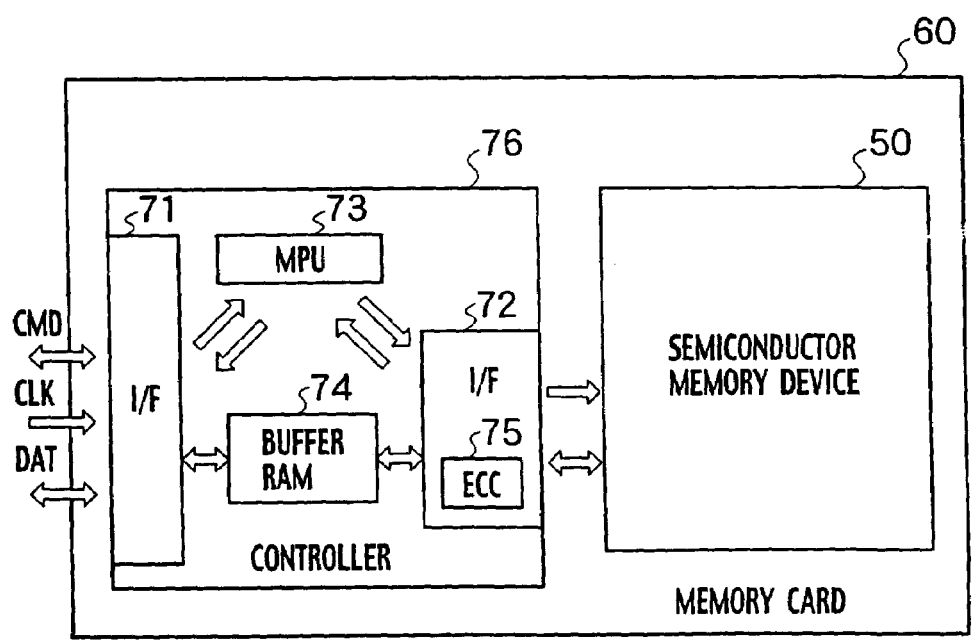
FIG. 28 is a schematic block diagram showing the internal configuration of the memory card to which is applied the nonvolatile semiconductor memory according to the twelfth embodiment of the present invention.

Another example of the memory card 60 includes, as shown in FIG. 28, a semiconductor memory device 50, and a controller 76 that controls the semiconductor memory device 50, and receives/transmits a prescribed signal from/to an external device, unlike with the example of the memory card of FIG. 27. The controller 76 has interface units (I/F) 71 and 72, a microprocessor unit (MPU) 73, buffer RAM 74, and an error correction code unit (ECC) 75 included in the I/F 72.

The I/F 71 receives/transmits a predetermined signal from/to an external device, and the I/F 72 receives/transmits a predetermined signal from/to the semiconductor memory device 50. The microprocessor unit (MPU) 73 converts a logic address to a physical address. The buffer RAM 74 temporarily stores data. The ECC 75 generates an error correction code.

A command line CMD, a clock signal line CLK, and a signal line DAT are connected to the memory card 60. The number of control signal lines, the bit width of signal line DAT, and the circuit structure of the controller 76 may be modified as desired.

APPLICATION EXAMPLE 3

Figure 29:
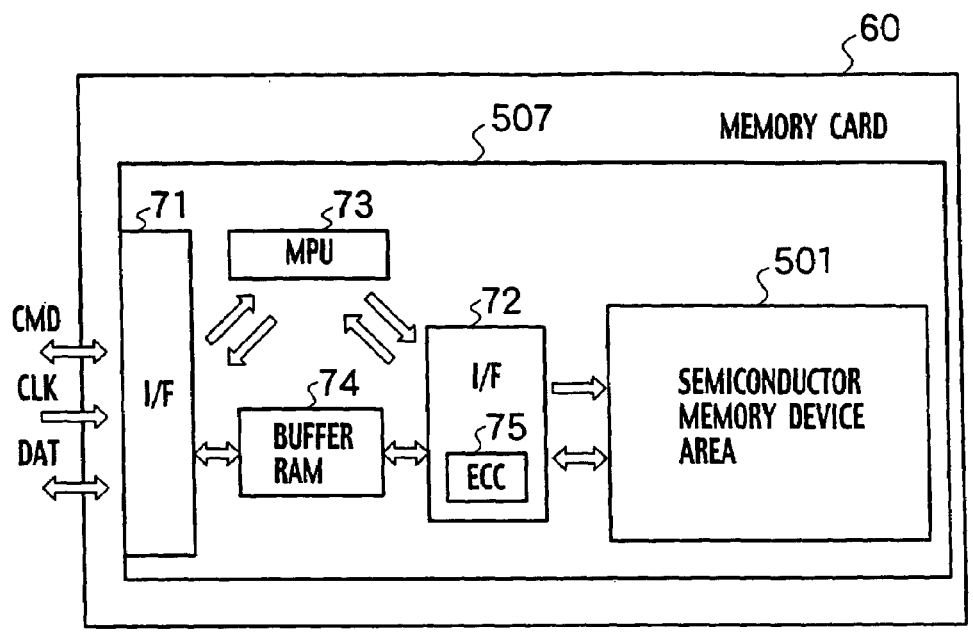
FIG. 29 is a schematic block diagram showing the internal configuration of the memory card to which is applied the nonvolatile semiconductor memory according to the twelfth embodiment of the present invention.

Another exemplary structure of the memory card 60 implements, as shown in FIG. 29, a system LSI chip 507 by integrating I/F 71 and 72, a MPU 73, buffer RAM 74, an ECC 75 included in the I/F 72, and a semiconductor memory device region 501, all onto one chip. Such system LSI chip 507 is loaded in the memory card 60.

APPLICATION EXAMPLE 4

Figure 30:
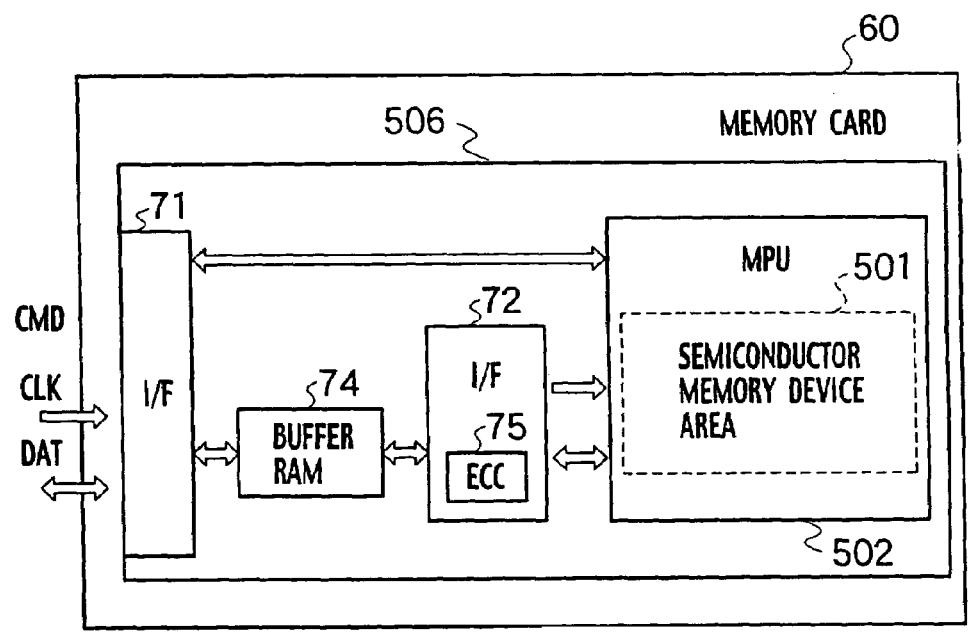
FIG. 30 is a schematic block diagram showing the internal configuration of the memory card to which is applied the nonvolatile semiconductor memory according to the twelfth embodiment of the present invention.

Another exemplary structure of the memory card 60 implements, as shown in FIG. 30, a memory mixed MPU 502 by forming the semiconductor memory device region 501 in the MPU 73, and further implements a system LSI chip 506 by integrating I/F 71 and 72, buffer RAM 74, and an ECC 75 included in the I/F 72 all onto one chip. Such system LSI chip 506 is loaded in the memory card 60.

APPLICATION EXAMPLE 5

Figure 31:
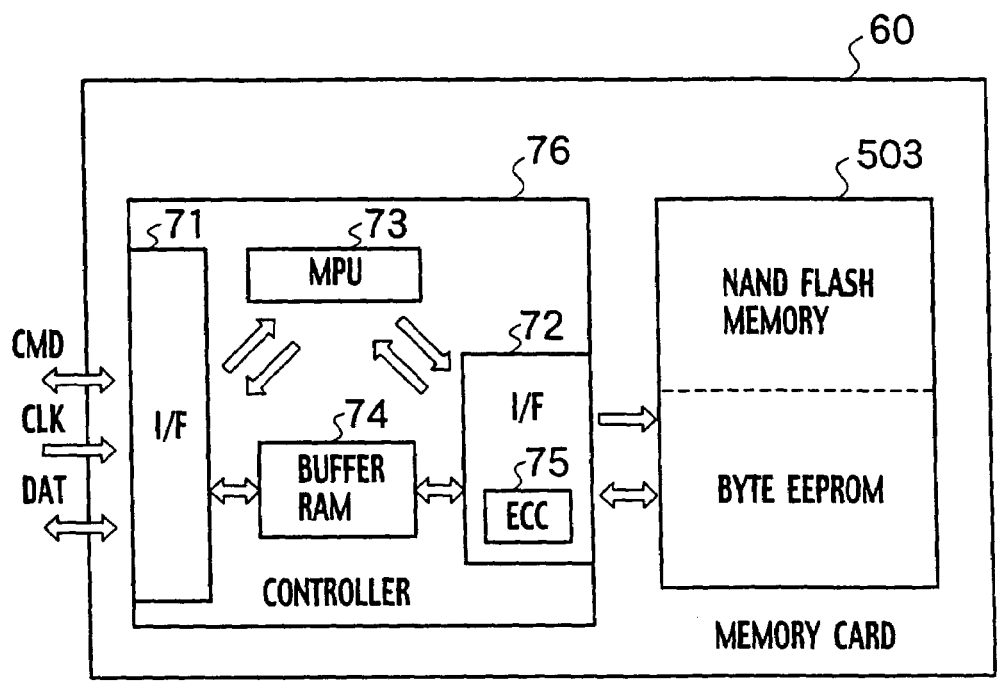
FIG. 31 is a schematic block diagram showing the internal configuration of the memory card to which is applied the nonvolatile semiconductor memory according to the twelfth embodiment of the present invention.

Another exemplary structure of the memory card 60 utilizes, as shown in FIG. 31, a ROM region included EEPROM mode flash memory 503, configured with a NAND flash memory and byte EEPROM, instead of the semiconductor memory device 50 shown in FIG. 27 or FIG. 28.

Naturally, it is possible to configure the system LSI chip 507 by forming the ROM region included EEPROM mode flash memory 503 in the same chip as the controller 76, as shown in FIG. 29, and integrating the ROM region included EEPROM mode flash memory and the controller onto one chip. In addition, as shown in FIG. 30, it is possible to implement a memory mixed MPU 502 by forming the ROM region included EEPROM mode flash memory 503 in the MPU 73, and to configure the system LSI chip 506 by integrating the I/Fs 71 and 72 and buffer RAM 74 all onto one chip.

APPLICATION EXAMPLE 6

Figure 32:
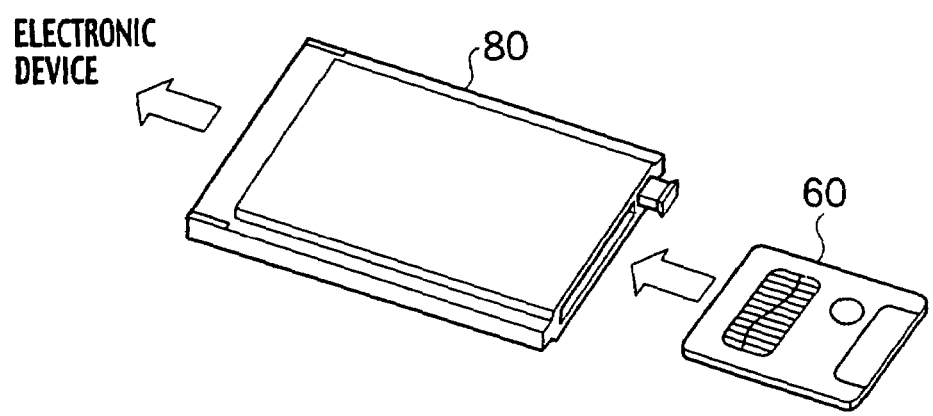
FIG. 32 shows a schematic structure of the memory card to which are applied the nonvolatile semiconductor memory according to the twelfth embodiment of the present invention and a card holder.

As an application example of the memory card 60 shown in FIG. 27 through FIG. 31, a memory card holder 80 may be utilized, as shown in FIG. 32. The memory card holder 80 may receive the memory card 60, which uses the nonvolatile semiconductor memory described in detail in the first through tenth embodiments of the present invention as a semiconductor memory device 50. The memory card holder 80 is connected to an electronic device (not shown in the drawing), and is operable as an interface between the memory card 60 and the electronic device. The memory card holder 80 is capable of executing various functions such as functions of the microcontroller 76, the MPU 73, the buffer RAM 74, the ECC 75, and the I/Fs 71 and 72 in the memory card 60 disclosed in FIG. 27 through FIG. 31.

APPLICATION EXAMPLE 7

Figure 33:
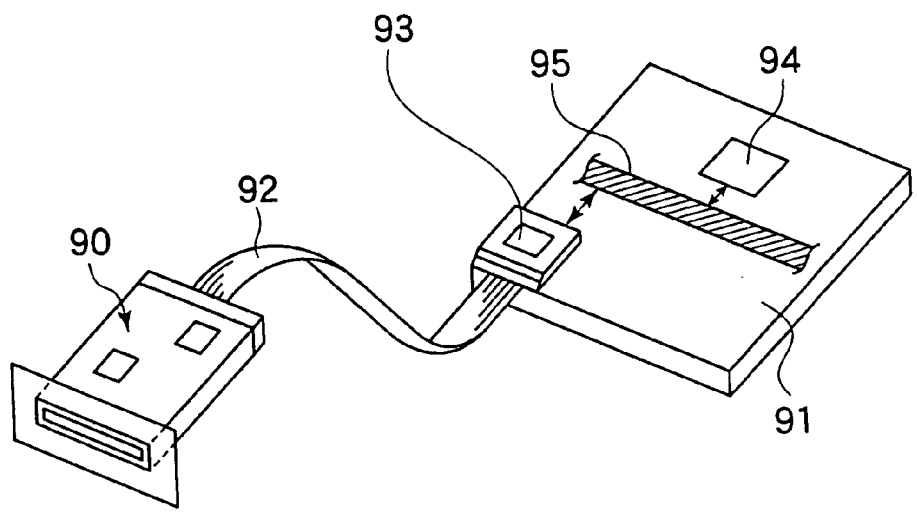
FIG. 33 shows a schematic structure of a connecting device, which is operable to receive the card holder and the memory card to which is applied the nonvolatile semiconductor memory according to the twelfth embodiment of the present invention.

Another application example is described while referencing FIG. 33. In FIG. 33, a connecting apparatus 90 capable of receiving the memory card 60 or the memory card holder 80 is disclosed. The nonvolatile semiconductor memory described in detail in the first through eleventh embodiments of the present invention is embedded in either the memory card 60 or the memory card holder 80 and is used as the semiconductor memory device 50, the semiconductor memory region 501, the memory mixed MPU 502, or the ROM region included EEPROM mode flash memory 503. The memory card 60 or the memory card holder 80 is attached to the connecting apparatus 90, and connected electrically. The connecting apparatus 90 is connected to a circuit board 91, which mounts a CPU 94 and a bus 95 via a connecting wire 92 and an interface circuit 93.

APPLICATION EXAMPLE 8

Figure 34:
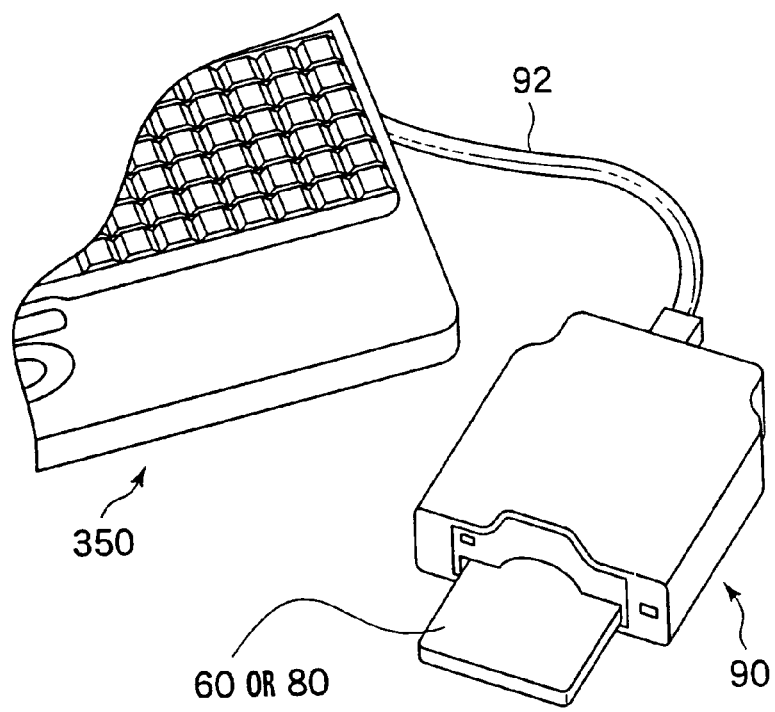
FIG. 34 shows a schematic structure of a coupling device, which connects via a connecting wire to a personal computer an internal memory card to which is applied the nonvolatile semiconductor memory according to the twelfth embodiment of the present invention.

Another application example is described while referencing FIG. 34. The nonvolatile semiconductor memory described in detail in the first through eleventh embodiments of the present invention is embedded in either the memory card 60 or the memory card holder 80 and is used as the semiconductor memory device 50, the semiconductor memory device region 501, the memory mixed MPU 502, or the ROM region included EEPROM mode flash memory 503. The memory card 60 or the memory card holder 80 is attached to the connecting apparatus 90, and connected electrically. The connecting apparatus 90 is connected to a personal computer (PC) 350 via a connecting wire 92.

APPLICATION EXAMPLE 9

Figure 35:
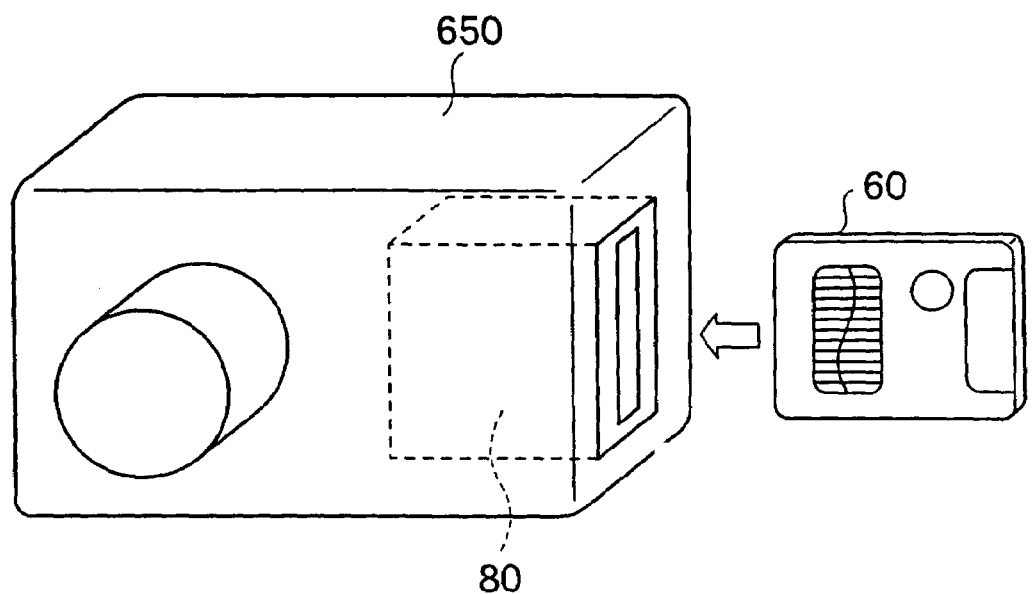
FIG. 35 is a digital camera system, which can be loaded with a memory card to which is applied the nonvolatile semiconductor memory according to the twelfth embodiment of the present invention.

Another application example is described while referencing FIG. 35. The memory card 60 includes the nonvolatile semiconductor memory described in detail in the first through eleventh embodiments of the present invention, which is used as the semiconductor memory device 50, the semiconductor memory device region 501, the memory mixed MPU 502, and the ROM region included EEPROM mode flash memory 503. FIG. 35 shows an example of providing such memory card 60 to a digital camera 650, which includes the memory card holder 80.

(IC Card)

APPLICATION EXAMPLE 10

Figure 36:
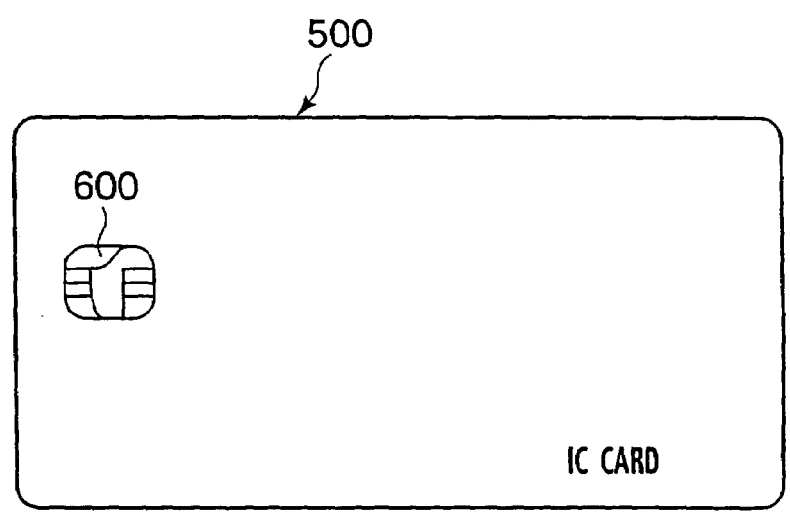
FIG. 36 shows a schematic structure of an IC card to which is applied the nonvolatile semiconductor memory according to the twelfth embodiment of the present invention.
Figure 37:
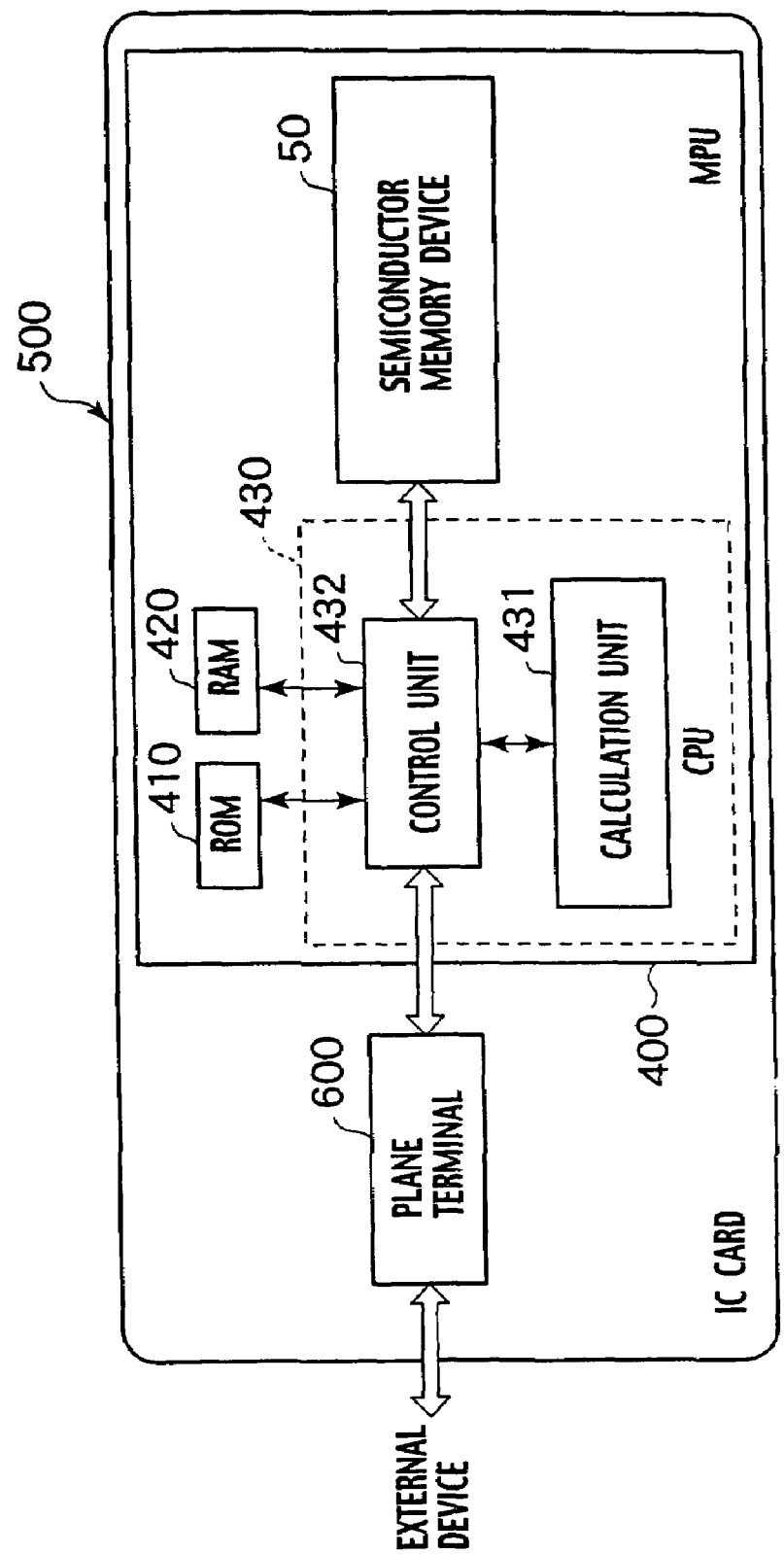
FIG. 37 is a schematic block diagram illustrating the internal structure of the IC card to which is applied the nonvolatile semiconductor memory according to the twelfth embodiment of the present invention.

Another application example of the nonvolatile semiconductor memory according to the first through eleventh embodiments of the present invention configures, as shown in FIG. 36 and FIG. 37, an interface circuit (IC) card 500, which includes an MPU 400 configured with a semiconductor memory device 50, ROM 410, RAM 420, and a CPU 430, and a plane terminal 600. The IC card 500 may be connected to an external device via the plane terminal 600. In addition, the plane terminal 600 is coupled to the MPU 400 in the IC card 500. The CPU 430 has a calculation section 431 and a control section 432. The control section 432 is coupled to the semiconductor memory device 50, ROM 410, and RAM 420. It is desirable that the MPU 400 be molded on one of the surfaces of the IC card 500, and the plane terminal 600 be fabricated on the other surface of the IC card 500. As shown in FIG. 37, the nonvolatile semiconductor memory described in detail in the first through eleventh embodiments of the present invention is applicable to the semiconductor memory device 50 or ROM 410. In addition, it is possible for the nonvolatile semiconductor memory to operate in page mode, byte mode, or ROM region included EEPROM mode.

APPLICATION EXAMPLE 11

Figure 38:
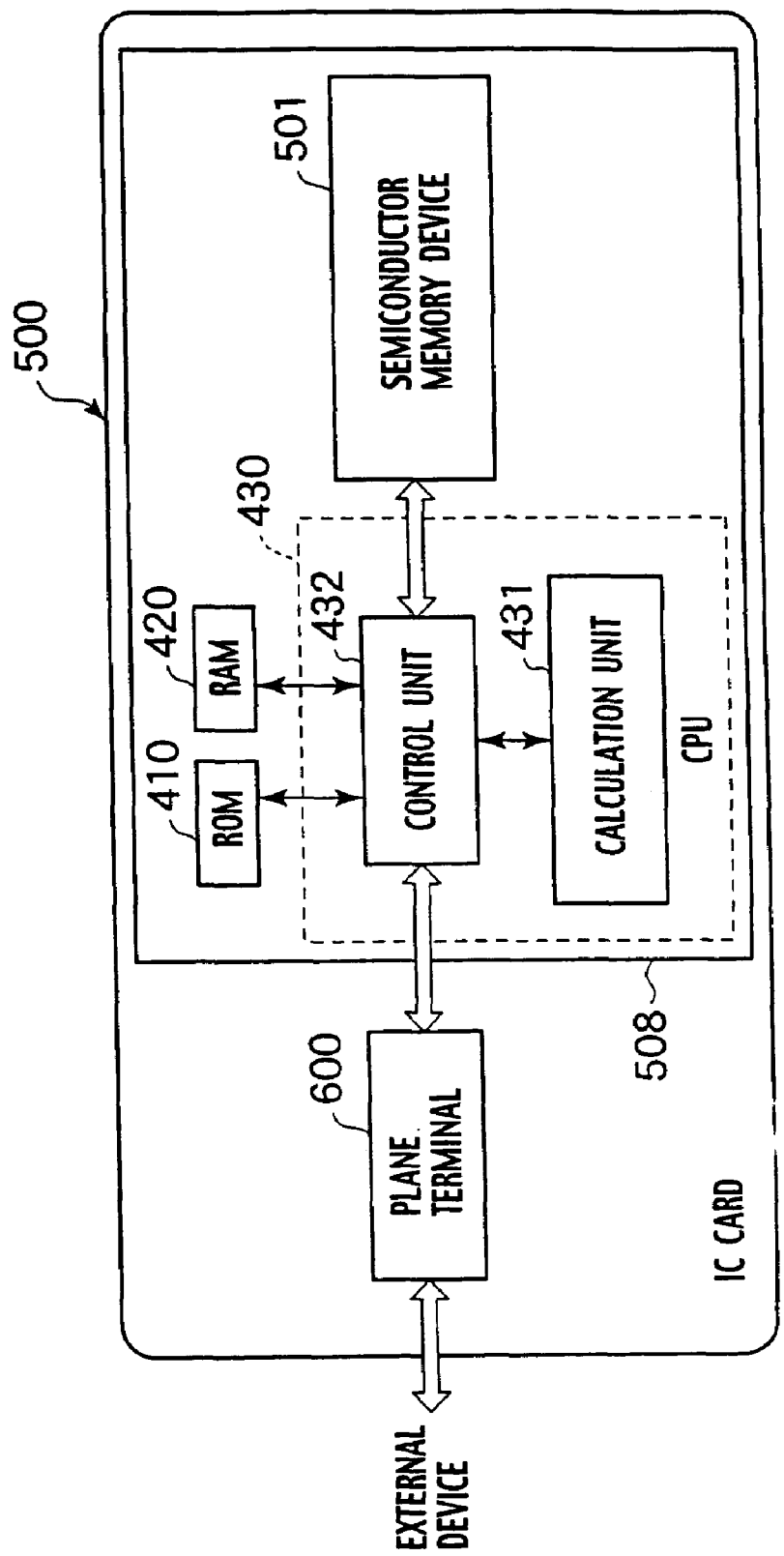
FIG. 38 is a schematic block diagram illustrating the internal structure of the IC card to which is applied the nonvolatile semiconductor memory according to the twelfth embodiment of the present invention.

Another exemplary structure of the IC card 500 includes, as shown in FIG. 38, a system LSI chip 508 with ROM 410, RAM 420, a CPU 430, and a semiconductor memory device region 501 integrated onto one chip. Such system LSI chip 508 is embedded in the IC card 500. As shown in FIG. 38, the nonvolatile semiconductor memory described in detail in the first through eleventh embodiments of the present invention is applicable to the semiconductor memory device region 501 or ROM 410. In addition, it is possible for the nonvolatile semiconductor memory to operate in page mode, byte mode, or ROM region included EEPROM mode.

APPLICATION EXAMPLE 12

Figure 39:
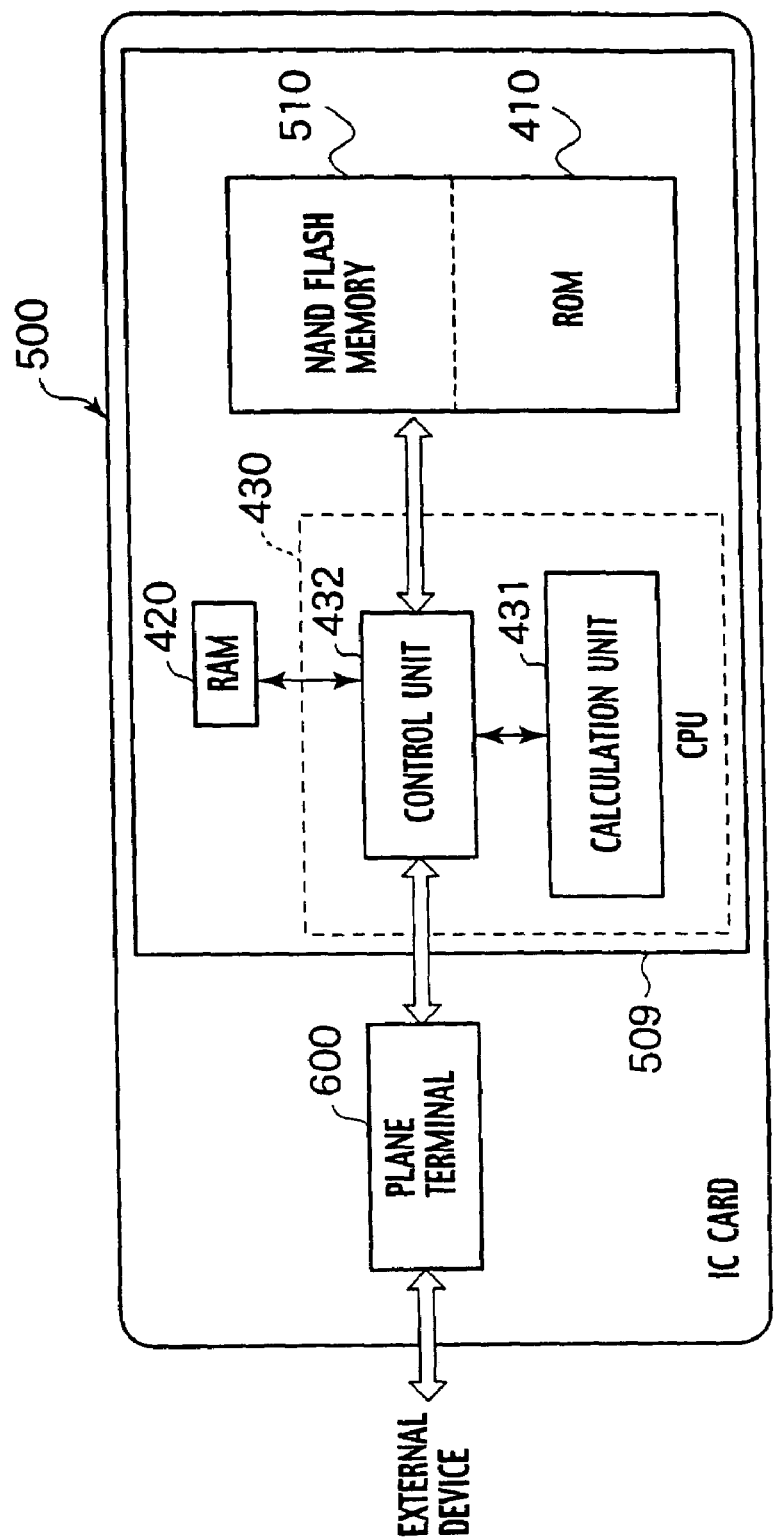
FIG. 39 is a schematic block diagram illustrating the internal structure of the IC card to which is applied the nonvolatile semiconductor memory according to the twelfth embodiment of the present invention.

Yet another exemplary structure of the IC card 500, as shown in FIG. 39, has the structure of ROM region included EEPROM mode flash memory 510 with an embedded ROM 410 in the semiconductor memory device region 501, and configures a single chip or a system LSI chip 509 integrating all of the ROM region included EEPROM mode flash memory 510, RAM 420, and the CPU 430. Such system LSI chip 509 is embedded in the IC card 500.

APPLICATION EXAMPLE 13

Figure 40:
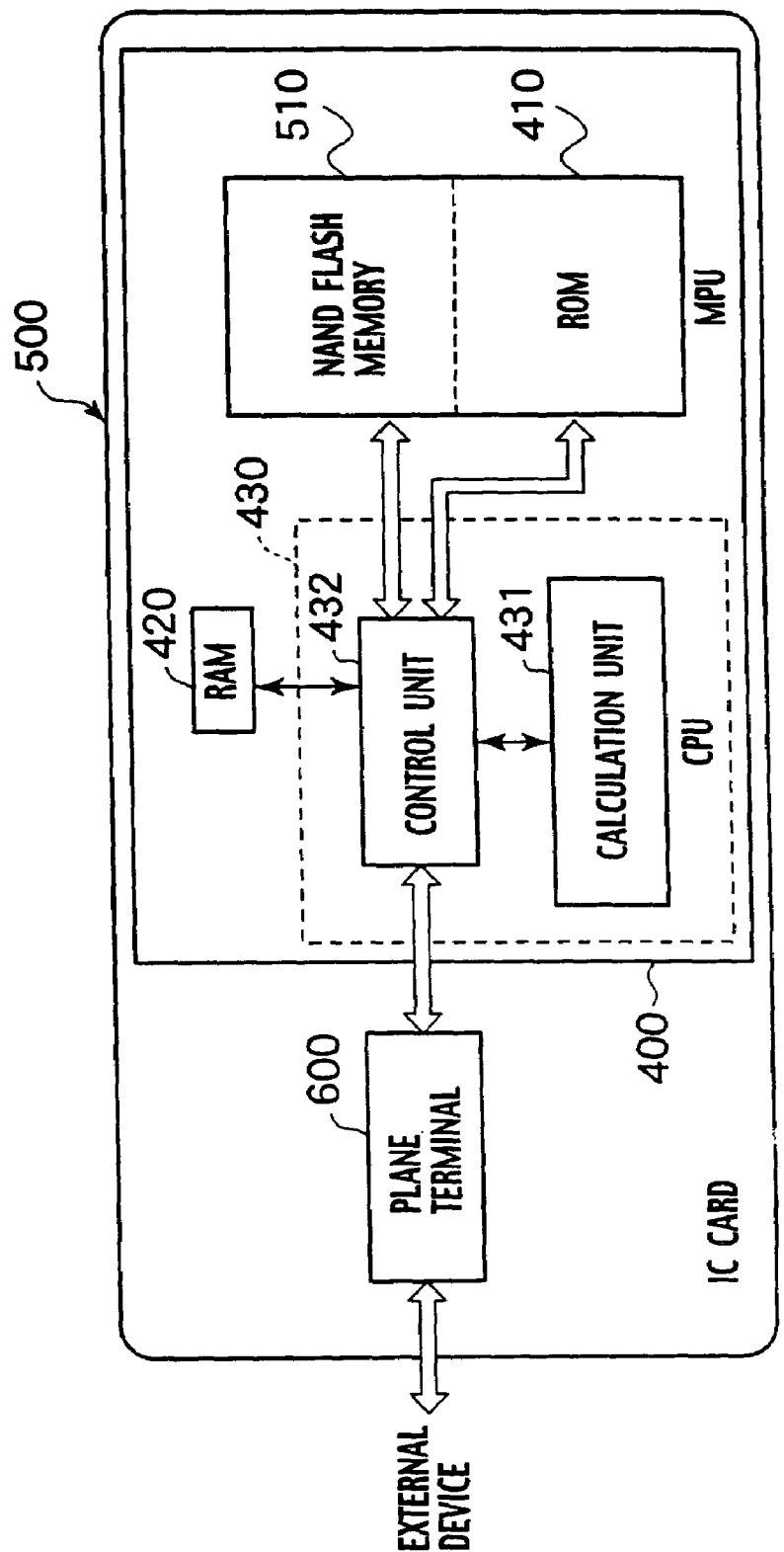
FIG. 40 is a schematic block diagram illustrating the internal structure of the IC card to which is applied the nonvolatile semiconductor memory according to the twelfth embodiment of the present invention.

Another exemplary structure of the IC card 500, as shown in FIG. 40, has an overall ROM region included EEPROM mode flash memory 510 structure with an embedded ROM 410 in the semiconductor memory device 50 shown in FIG. 37. Such ROM region included EEPROM mode flash memory 510 is embedded in the MPU 400 as with FIG. 37.

As described above, the present invention is explained according to various embodiments. However, it should not be perceived that descriptions and drawings forming a part of this disclosure are intended to limit the present invention. Various alternative embodiments, working examples, and operational techniques will become apparent from this disclosure for those skilled in the art. Accordingly, the technical range of the present invention is determined only by specified features of the invention according to the above-described descriptions and appropriate appended claims.

Furthermore, various combinations of the nonvolatile semiconductor memories disclosed by the embodiments of the present invention and the modified examples thereof are feasible.

According to the present invention, wide industrial applicability is achieved not only for a memory card and IC card, but for a vehicle system, a hard disk driver, a portable phone, high-speed network modem equipment, and the like.

OTHER EMBODIMENTS

While the present invention is described in accordance with the aforementioned embodiments, it should be understood that the description and drawings that configure part of this disclosure are not limited to the present invention. This disclosure makes clear a variety of alternative embodiments, working examples, and operational techniques for those skilled in the art. Accordingly, the technical scope of the present invention is defined by only the claims of the appropriate above explanation.

Various modifications will become possible for those skilled in the art after receiving the teachings of the present disclosure without departing from the scope thereof.

What is claimed is:

1. A nonvolatile semiconductor memory comprising:
   a memory sub array including a plurality of memory cell units, each of which having a memory cell transistor and a select transistor connected in series;
   a control gate line driver including a control gate line driver transistor connected to a control gate of the memory cell transistor; and
   a select transistor gate line driver including a select gate line driver transistor connected to a select gate of the select transistor,
   wherein a thickness of a gate insulating film of the control gate line driver transistor is thicker than a thickness of a gate insulating film of the select gate line driver transistor.

2. The nonvolatile semiconductor memory of claim 1, wherein a read voltage is applied to the control gate during a read-out operation.

3. The nonvolatile semiconductor memory of claim 1, wherein the select gate line is short-circuited by an upper layer metal wiring.

4. The nonvolatile semiconductor memory of claim 1, further comprising another select gate line driver transistor connected to the select gate line driver transistor in series.

5. The nonvolatile semiconductor memory of claim 1, wherein the control gate line driver transistor is located in a double well region having n-well and p-well regions.

6. The nonvolatile semiconductor memory of claim 1, wherein a well potential for the memory sub array is set to a first erase voltage higher than a read voltage, the select gate line is set to a second erase voltage higher than the read voltage, by capacitive coupling with a well, a gate of the select gate line driver transistor is set to a third voltage equal to a power supply voltage, and a drain of the select gate line driver transistor at an opposite end to the select gate line is set to a fourth voltage equal to a power supply voltage during an erase operation, respectively.

7. The nonvolatile semiconductor memory of claim 6, wherein the third voltage and the fourth voltage are set to a potential higher than the read voltage.

8. A nonvolatile semiconductor memory comprising:
   a plurality of memory sub arrays including a plurality of memory cell units, each of which having a memory cell transistor and a select transistor connected in series;
      a control gate line driver including a control gate line driver transistor connected to a control gate of the memory cell transistor; and
      a plurality of select transistor gate line drivers including a select gate line driver transistor connected to a select gate of the select transistor,
      wherein a number of memory sub arrays driven by the control gate line driver is greater than a number of memory sub arrays driven by the select transistor gate line driver.

9. The nonvolatile semiconductor memory of claim 8, wherein a thickness of a gate insulating film of the control gate line driver transistor is thicker than a thickness of a gate insulating film of the select gate line driver transistor.

10. The nonvolatile semiconductor memory of claim 8, wherein the select gate line is short-circuited by an upper layer metal wiring.

11. A nonvolatile semiconductor memory comprising:
   a plurality of memory sub arrays, each of which including a memory cell unit having a memory cell transistor and two select transistors sandwiching the memory cell transistor;
   a control gate line driver including a control gate line driver transistor connected to a control gate of the memory cell transistor; and
   a plurality of select transistor gate line drivers including a select gate line driver transistor connected to a select gate of the select transistor,
   wherein a thickness of a gate insulating film of the control gate line driver transistor is thicker than a thickness of a gate insulating film of the select gate line driver transistor.

12. The nonvolatile semiconductor memory of claim 11, wherein a read voltage is applied to the control gate during a read-out operation.

13. The nonvolatile semiconductor memory of claim 11, wherein a number of memory sub arrays driven by the control gate line driver is greater than a number of memory sub arrays driven by the select transistor gate line driver.

14. The nonvolatile semiconductor memory of claim 11, wherein a select gate line is short circuited by an upper layer metal wiring.

15. The nonvolatile semiconductor memory of claim 11, further comprising another select gate line driver transistor connected to the select gate line driver transistor in series.

16. The nonvolatile semiconductor memory of claim 11, wherein the control gate line driver transistor is located in a double well region having n-well and p-well regions.

17. The nonvolatile semiconductor memory of claim 11, wherein a well potential for the memory sub array is set to a first erase voltage higher than a read voltage, the select gate line is set to a second erase voltage higher than the read voltage, by capacitive coupling with a well, a gate of the select gate line driver transistor is set to a third voltage equal to a power supply voltage, and a drain of the select gate line driver transistor at an opposite end to the select gate line is set to a fourth voltage equal to a power supply voltage during an erase operation, respectively.

18. The nonvolatile semiconductor memory of claim 17, wherein the third voltage and the fourth voltage are set to a potential higher than the read voltage.

* * * * *